(12) United States Patent
Sasaki et al.

(10) Patent No.: US 9,966,291 B2
(45) Date of Patent: May 8, 2018

(54) DE-CHUCK CONTROL METHOD AND PLASMA PROCESSING APPARATUS

(71) Applicant: Tokyo Electron Limited, Tokyo (JP)

(72) Inventors: Junichi Sasaki, Miyagi (JP); Masaaki Miyagawa, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 404 days.

(21) Appl. No.: 14/420,695

(22) PCT Filed: Sep. 11, 2013

(86) PCT No.: PCT/JP2013/074492
§ 371 (c)(1),
(2) Date: Feb. 10, 2015

(87) PCT Pub. No.: WO2014/042174
PCT Pub. Date: Mar. 20, 2014

(65) Prior Publication Data
US 2015/0194330 A1   Jul. 9, 2015

Related U.S. Application Data

(60) Provisional application No. 61/703,410, filed on Sep. 20, 2012.

(30) Foreign Application Priority Data

Sep. 12, 2012   (JP) ................................ 2012-200518

(51) Int. Cl.
H01L 21/683 (2006.01)
H01T 23/00 (2006.01)
(Continued)

(52) U.S. Cl.
CPC ...... *H01L 21/6831* (2013.01); *H01L 21/3065* (2013.01); *H01L 21/68792* (2013.01)

(58) Field of Classification Search
CPC .................................................. H01L 21/6831
(Continued)

(56) References Cited

U.S. PATENT DOCUMENTS

| 5,552,955 A * | 9/1996 | Mashiro | H01L 21/6831 361/213 |
| 2003/0236004 A1* | 12/2003 | Sung | H01L 21/6833 438/795 |
| 2013/0021717 A1* | 1/2013 | Singh | H01L 21/6831 361/234 |

FOREIGN PATENT DOCUMENTS

| JP | H03-243188 | 10/1991 |
| JP | H5-047910 | 2/1993 |

(Continued)

OTHER PUBLICATIONS

Physics Dictionary Editorial Board, Physics Dictionary, Baifukan Co., Ltd. Sep. 30, 1984 with partial English translation.

*Primary Examiner* — Thienvu Tran
*Assistant Examiner* — Lucy Thomas
(74) *Attorney, Agent, or Firm* — IPUSA, PLLC

(57) ABSTRACT

A de-chuck control method is provided for de-chucking a workpiece from an electrostatic chuck that electrostatically attracts the workpiece. The de-chuck control method includes a discharge step of introducing an inert gas into a chamber after a plasma process and performing a discharge process; a high pressure step of introducing a gas having a lower ionization energy than helium gas after the discharge step, and maintaining a pressure within the chamber to a higher pressure than a pressure during the plasma process or a pressure during the discharge step; and a de-chuck step of de-chucking the workpiece from the electrostatic chuck with (Continued)

a support pin while the higher pressure is maintained by the high pressure step or after the higher pressure is maintained by the high pressure step.

6 Claims, 29 Drawing Sheets

(51) Int. Cl.
*H01L 21/3065* (2006.01)
*H01L 21/687* (2006.01)

(58) Field of Classification Search
USPC .......................................................... 361/234
See application file for complete search history.

(56) References Cited

FOREIGN PATENT DOCUMENTS

| | | |
|---|---|---|
| JP | H07-130825 | 5/1995 |
| JP | H07-263531 | 10/1995 |
| JP | H09-064021 | 3/1997 |
| JP | H11-260897 | 9/1999 |
| JP | 3315197 | 8/2002 |
| JP | 2003-282691 | 10/2003 |
| JP | 2004-047511 | 2/2004 |
| JP | 2010-272709 | 12/2010 |

* cited by examiner

I: NEUTRAL ATOM, II: MONOVALENT ION, III: BIVALENT ION··· NUMBERS IN THE CHART REPRESENT THE ENERGY REQUIRED TO TAKE AWAY ONE ELECTRON FROM THE OUTERMOST SHELL OF NEGATIVE IONS (ELECTRON AFFINITY), NEUTRAL ATOMS (I), OR POSITIVE IONS (II, III,···).

| Z | ELEMENT | ELECTRON AFFINITY | I | II | III | IV | V | VI |
|---|---------|-------------------|---|----|----|----|---|----|
| 1 | H | 0.7542 | 13.598 | | | | | |
| 2 | He | <0 | 24.587 | 54.416 | | | | |
| 3 | Li | 0.618 | 5.392 | 75.638 | 122.451 | | | |
| 4 | Be | <0 | 9.322 | 18.211 | 153.893 | 217.713 | | |
| 5 | B | 0.277 | 8.298 | 25.154 | 37.930 | 259.368 | 340.217 | |
| 6 | C | 1.2629 | 11.260 | 24.383 | 47.887 | 64.492 | 392.077 | 489.981 |
| 7 | N | −0.07 | 14.534 | 29.601 | 47.448 | 77.472 | 97.888 | 552.057 |
| 8 | O | 1.4611 | 13.618 | 35.116 | 54.934 | 77.412 | 113.896 | 138.116 |
| 9 | F | 3.399 | 17.422 | 34.970 | 62.707 | 87.138 | 114.240 | 157.161 |
| 10 | Ne | <0 | 21.564 | 40.962 | 63.45 | 97.11 | 126.21 | 157.93 |
| 11 | Na | 0.54793 | 5.139 | 47.286 | 71.64 | 98.91 | 138.39 | 172.15 |
| 12 | Mg | <0 | 7.646 | 15.035 | 80.143 | 109.24 | 141.26 | 186.50 |
| 13 | Al | 0.441 | 5.986 | 18.828 | 28.447 | 119.99 | 153.71 | 190.47 |
| 14 | Si | 1.385 | 8.152 | 16.345 | 33.492 | 45.141 | 166.77 | 205.05 |
| 15 | P | 0.7465 | 10.486 | 19.725 | 30.18 | 51.37 | 65.023 | 220.43 |
| 16 | S | 2.0771 | 10.360 | 23.33 | 34.83 | 47.30 | 72.68 | 88.049 |
| 17 | Cl | 3.617 | 12.967 | 23.81 | 39.61 | 53.46 | 67.8 | 97.03 |
| 18 | Ar | <0 | 15.760 | 27.629 | 40.74 | 59.81 | 75.02 | 91.007 |
| 19 | K | 0.50147 | 4.341 | 31.625 | 45.72 | 60.91 | 82.66 | 100.0 |
| 20 | Ca | | 6.113 | 11.871 | 50.908 | 67.10 | 84.41 | 108.78 |
| 21 | Sc | 0.188 | 6.54 | 12.80 | 24.76 | 73.47 | 91.66 | 111.1 |
| 22 | Ti | 0.079 | 6.82 | 13.58 | 27.491 | 43.266 | 99.22 | 119.36 |
| 23 | V | 0.525 | 6.74 | 14.65 | 29.310 | 46.707 | 65.23 | 128.12 |
| 24 | Cr | 0.666 | 6.766 | 16.50 | 30.96 | 49.1 | 69.3 | 90.56 |
| 25 | Mn | <0 (?) | 7.435 | 15.640 | 33.667 | 51.2 | 72.4 | 95 |
| 26 | Fe | 0.163 | 7.870 | 16.18 | 30.651 | 54.8 | 75.0 | 99 |
| 27 | Co | 0.661 | 7.864 | 17.06 | 33.50 | 51.3 | 79.5 | 102 |
| 28 | Ni | 1.156 | 7.635 | 18.168 | 35.17 | 54.9 | 75.5 | 108 |
| 29 | Cu | 1.228 | 7.726 | 20.292 | 36.83 | 55.2 | 79.9 | 103 |
| 30 | Zn | <0 | 9.394 | 17.964 | 39.722 | 59.4 | 82.6 | 108 |

FIG.27

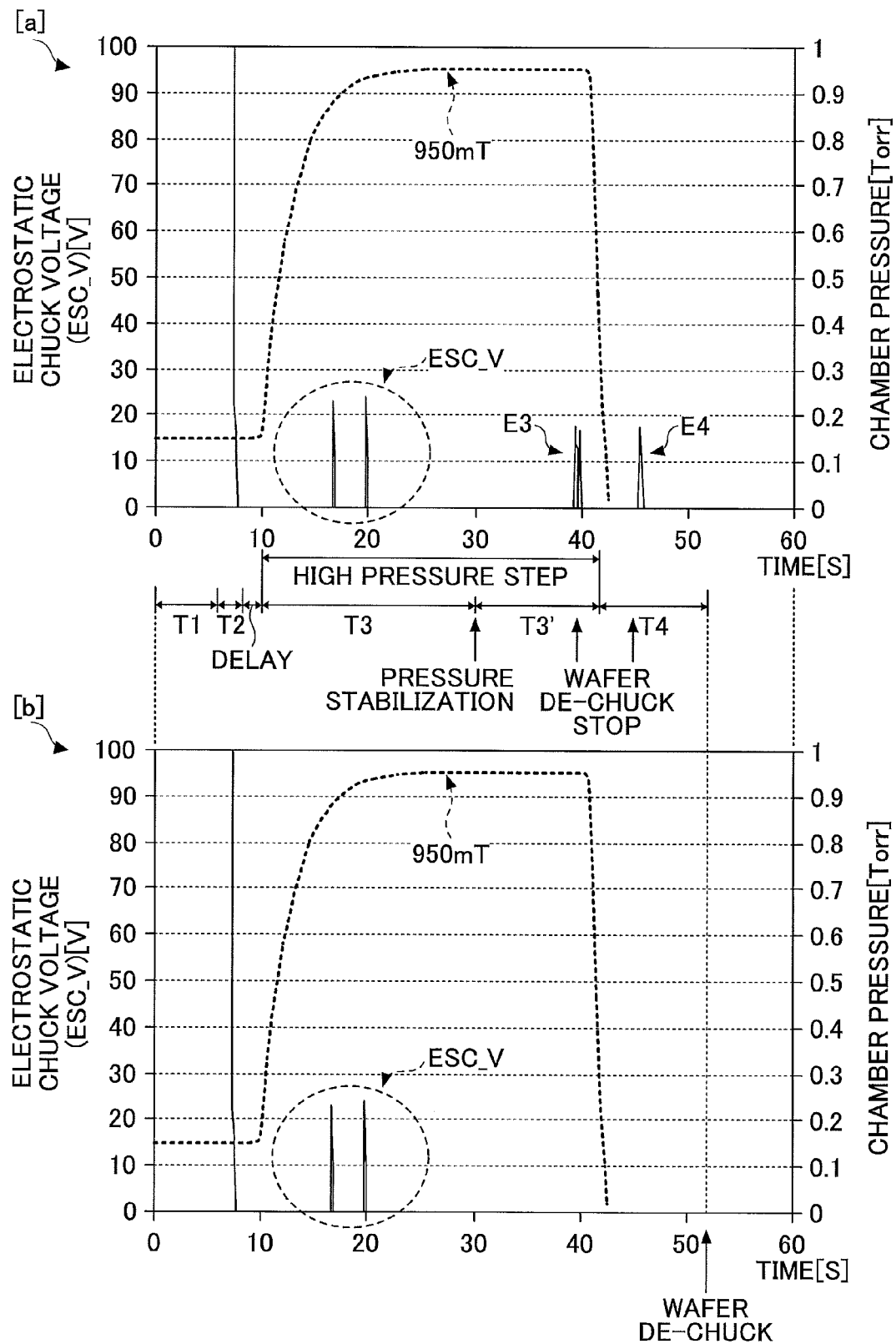

DE-CHUCK CONTROL METHOD AND PLASMA PROCESSING APPARATUS

TECHNICAL FIELD

The present invention relates to a de-chuck control method and a plasma processing apparatus.

BACKGROUND ART

A plasma process is often performed under a vacuum atmosphere by vacuuming gas from a processing chamber. In such case, a workpiece is placed on an electrostatic chuck (ESC) that is arranged on a mounting table within the processing chamber.

The electrostatic chuck includes a chuck electrode made of a conductive sheet and dielectric members arranged on a surface and a backside surface of the chuck electrode. A workpiece such as a wafer is electrostatically attracted to the electrostatic chuck by a Coulomb force that is generated when a voltage from a DC voltage supply is applied to the electrostatic chuck. A plasma process is performed while the workpiece is electrostatically attracted to the surface of the electrostatic chuck as described above. In some cases, a heat transfer gas may be supplied between a backside surface of the wafer and the surface of the electrostatic chuck.

When the plasma process is completed, voltage application to the electrostatic chuck is stopped so that a Coulomb force may not be generated, and the workpiece is de-chucked from the electrostatic chuck. An exemplary method of de-chucking the workpiece may involve raising support pins that are embedded within the mounting table and lifting the workpiece from the electrostatic chuck.

In order to de-chuck the workpiece in a more reliable manner, a discharge process is performed for discharging (removing) an electric charge remaining in the electrostatic chuck and the workpiece. For example, after stopping the voltage application to the chuck electrode, an inert gas may be introduced into the chamber and the pressure within the chamber may be maintained at a predetermined pressure. Further, a high frequency power for plasma generation may be applied to generate a plasma that is weak enough to be incapable of etching the workpiece, and a discharge process may be performed by moving the residual charge residing within the electrostatic chuck and the workpiece into a plasma space.

For example, in Patent Document 1, after a plasma process is completed, a high frequency power that is weak enough to be incapable of etching a wafer is applied and the supply of a heat transfer gas is stopped. The ions or electrons within a plasma generated by the high frequency power enter between a surface of the wafer and a surface of the electrostatic chuck to neutralize a residual charge charging the surface of the wafer from a peripheral edge portion of the wafer toward the center of the wafer. Pins are raised as the above neutralization progresses, and the wafer is thereby de-chucked.

PRIOR ART DOCUMENTS

Patent Documents

Patent Document 1: Japanese Patent No. 3315197

SUMMARY OF THE INVENTION

Problem to be Solved by the Invention

However, reaction products may be deposited on the surface of the electrostatic chuck when a plasma process is performed for a long period of time. In a case where the deposited substances accumulate an electric charge, the amount of electric charge remaining on the surface of the electrostatic chuck increases as the plasma process time progresses. Oftentimes, the electric charge remaining at a surface layer of the electrostatic chuck cannot be removed even when the above discharge process is performed. When support pins are lifted in a state where an electrostatic attraction force remains due to the residual charge, the workpiece may be prone to defects such as cracking or misalignment, for example.

In view of the above, one aspect of the present invention relates to providing a de-chuck control method and a plasma processing apparatus that are capable of preventing attraction of a workpiece by a residual charge at a surface layer of an electrostatic chuck.

Means for Solving the Problem

According to one embodiment of the present invention, a de-chuck control method is provided for de-chucking a workpiece from an electrostatic chuck that electrostatically attracts the workpiece. The de-chuck control method includes a discharge step of introducing an inert gas into a chamber after a plasma process and performing a discharge process; a high pressure step of introducing a gas having a lower ionization energy than helium gas after the discharge step, and maintaining a pressure within the chamber to a higher pressure than a pressure during the plasma process or a pressure during the discharge step; and a de-chuck step of de-chucking the workpiece from the electrostatic chuck with a support pin while the higher pressure is maintained by the high pressure step or after the higher pressure is maintained by the high pressure step.

According to another embodiment of the present invention, a plasma processing apparatus is provided that includes an electrostatic chuck having a chuck electrode and being configured to electrostatically attract a workpiece, and a control unit configured to introduce an inert gas into a chamber after a plasma process and perform a discharge process. After performing the discharge process, the control unit introduces a gas having a lower ionization energy than helium gas and maintains a pressure within the chamber to a higher pressure than a pressure during the plasma process or a pressure during the discharge process, and while maintaining the higher pressure or after maintaining the higher pressure, the control unit controls the workpiece to be de-chucked from the electrostatic chuck by a support pin.

Advantageous Effect of the Invention

According to an aspect of the present invention, attraction of a workpiece by a residual charge at a surface layer of an electrostatic chuck may be prevented.

BRIEF DESCRIPTION OF THE DRAWINGS

FIG. 27 is a chart indicating the energy required to take away one electron from the outermost shell of a neutral atom;

FIG. 29 illustrate specific examples of performing the de-chuck control method according to the modified embodiment.

EMBODIMENTS FOR IMPLEMENTING THE INVENTION

Figure 1:
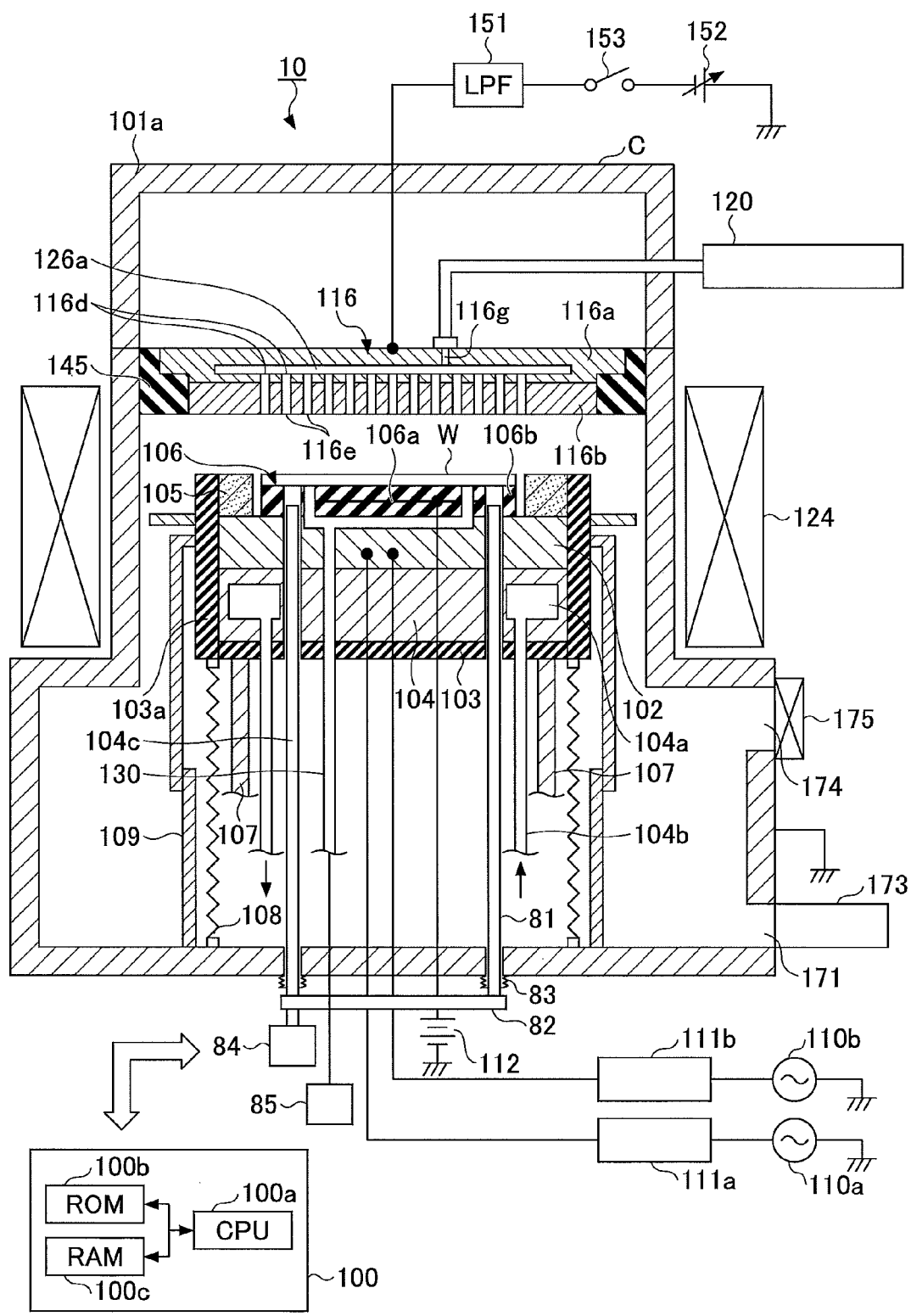
FIG. 1 is a cross-sectional view of an etching apparatus according to an embodiment of the present invention.

In the following, embodiments of the present invention are described with reference to the accompanying drawings. Note that in the following descriptions and the accompanying drawings, elements having substantially the same functions or features may be given the same reference numerals and overlapping descriptions thereof may be omitted.

[Etching Apparatus]

First, a configuration of an etching apparatus as an example of a plasma processing apparatus according to an embodiment of the present invention is described with reference to FIG. 1. FIG. 1 is a cross-sectional view of a lower side dual frequency type parallel plate plasma etching apparatus.

The etching apparatus 10 includes a chamber C that is kept airtight and is electrically grounded. The etching apparatus 10 is connected to a gas supply source 120. The chamber C is cylindrically shaped and may be made of aluminum having an alumite-treated (anodized) surface, for example. A mounting table 102 that is configured to hold a silicon wafer W (simply referred to as "wafer W" hereinafter) is arranged within the chamber C. The mounting table 102 may also act as a lower electrode. The mounting table 102 is supported on a conductive support 104 and is configured to be moved up and down by an elevating mechanism 107 via an insulating plate 103. The elevating mechanism 107 is arranged in the chamber C and is covered by a bellows 108 made of stainless steel. A bellows cover 109 is arranged over the outer side of the bellows 108. A focus ring 105 made of monocrystalline silicon, for example, is arranged at an upper outer periphery of the mounting table 102. Further, a cylindrical inner wall member 103a made of quartz, for example, is arranged to surround the periphery of the mounting table 102 and the support 104.

A first high frequency power source 110a is connected to the mounting table 102 via a first matching unit 111a, and the first high frequency power source 110a is configured to supply a high frequency power of a predetermined frequency (e.g. 40 MHz) for plasma generation. Further, a second high frequency power source 110b is connected to the mounting table 102 via a second matching unit 111b, and the second high frequency power source 110b is configured to supply a high frequency power of a predetermined frequency (e.g. 3.2 MHz) for biasing. Also, a shower head 116 that also acts as an upper electrode is arranged above the mounting table 102 facing parallel to the mounting table 102. The shower head 116 and the mounting table 102 are configured to act as a pair of electrodes.

An electrostatic chuck 106 for electrostatically attracting the wafer W is arranged on an upper surface of the mounting table 102. The electrostatic chuck 106 has a chuck electrode 106a arranged within an insulator 106b. A DC voltage source 112 is connected to the chuck electrode 106*a*. By applying a DC voltage from the DC voltage source 112 to the chuck electrode 106*a*, the wafer W may be electrostatically attracted to the electrostatic chuck 106 by a Coulomb force.

A coolant path 104*a* is formed within the support 104. A coolant inlet pipe 104*b* and a coolant outlet pipe 104*c* are connected to the coolant path 104*a*. By circulating a suitable coolant such as cooling water within the coolant path 104*a*, the wafer W may be controlled to a predetermined temperature.

A heat transfer gas supply source 85 supplies a heat transfer gas such as helium gas (He) or argon gas (Ar) through a gas supply line 130 to a backside surface of the wafer W that is placed on the electrostatic chuck 106.

A plurality (e.g. three) of support pins 81 for raising and lowering the wafer W to transfer the wafer W to/from a transfer arm are arranged within the mounting table 102. The plurality of support pins 81 are moved up and down by the power of a motor 84 transmitted via a connecting member 82. Bottom bellows 83 are arranged at through holes for enabling the support pins 81 to penetrate through the chamber C toward the outside, and the bottom bellows 83 are configured to maintain airtightness between the vacuum side and the atmosphere side of the chamber C.

The shower head 116 is arranged at a ceiling portion of the chamber C. The shower head 116 includes a main body 116*a* and an upper plate 116*b* forming an electrode plate. The shower head 116 is supported at an upper portion of the chamber by a side wall of the chamber C via an insulating member 145. The main body 116*a* may be made of a conductive material such as aluminum having an alumite-treated (anodized) surface, for example, and is configured to detachably support the upper plate 116*b* thereunder.

A gas diffusion chamber 126*a* is arranged within the main body 116*a*, and multiple gas passage holes 116*d* are formed at a bottom portion of the main body 116*a* to be positioned below the diffusion chamber 126*a*. Multiple gas introducing holes 116*e* communicating with the gas passage holes 116*d* are formed at the upper plate 116*b* to penetrate through the upper plate 116*b* in its thickness direction. With such a configuration, gas that is supplied to the diffusion chamber 126*a* may be showered into a plasma process space within the chamber C via the gas passage holes 116*d* and the gas introducing holes 116*e*. Note that a piping (not shown) for circulating a coolant may be arranged within the main body 116*a*, for example, so that the shower head 116 may be cooled and adjusted to a desired temperature.

A gas inlet 116*g* for introducing gas into the diffusion chamber 126*a* is formed at the main body 116*a*. The gas supply source 120 is connected to the gas inlet 116*g*. The gas supply source 120 is configured to supply an etching gas for executing an etching process on the wafer W.

A variable DC voltage source 152 is electrically connected to the shower head 116 via a low pass filter (LPF) 151. Power supply by the variable DC voltage source 152 may be turned on/off by an on/off switch 153. The on/off switch 153 may be turned on as is necessary when high frequencies from the first high frequency power source 110*a* and the second high frequency power source 110*b* are applied to the mounting table 102 and a plasma is generated within the plasma process space, for example. In this way, a predetermined DC voltage may be applied to the shower head 116.

A cylindrical ground conductor 101*a* is arranged to extend higher than the height of the shower head 116 from the side wall of the chamber C. The cylindrical ground conductor 101*a* has a top plate arranged thereon. An exhaust port 171 is formed at a bottom portion of the chamber C. The exhaust port 171 is connected to an exhaust device 173. The exhaust device 173 includes a vacuum pump and is configured to reduce the pressure within the chamber C to a predetermined degree of vacuum by operating the vacuum pump. A gate valve 175 is arranged at the side wall of the chamber C, and the gate valve 175 may be opened/closed to load/unload the wafer W via a transfer port 174.

A dipole ring magnet 124 is arranged to extend annularly or concentrically around the chamber C at a peripheral portion of the chamber C corresponding to vertical positions of the mounting table 102 when a process is performed.

With such a configuration, an RF field in the vertical direction may be formed by the first high frequency power source 110*a* and a horizontal magnetic field may be formed by the dipole ring magnet 124 within the space between the mounting table 102 and the showerhead 116. A high-density plasma may be generated near the surface of the mounting table 102 by magnetron discharge using these orthogonal electromagnetic fields.

A control device 100 is configured to control the individual components of the etching apparatus 10 such as the gas supply source 120, the exhaust device 173, the high frequency power sources 110*a* and 110*b*, the matching units 111*a* and 111*b*, the DC voltage source 112, the motor 84, and the heat transfer gas supply source 85.

The control device 100 includes a CPU (Central Processing Unit) 100*a*, a ROM (Read Only Memory) 100*b*, and a RAM (Random Access Memory) 100*c*. The CPU 100*a* executes a plasma process according to various recipes stored in storage areas of the above memories. The recipes include apparatus control information for process conditions, such as process time, temperatures within the processing chamber (upper electrode temperature, chamber side wall temperature, ESC temperature, etc.), pressure (gas exhaust), high frequency power and voltage to be applied, flow rates of various process gases, and the flow rate of the heat transfer gas, for example. The above is a description of the overall configuration of the etching apparatus 10 according to the present embodiment.

[Residual Charge of Electrostatic Chuck Surface]

Figure 2:
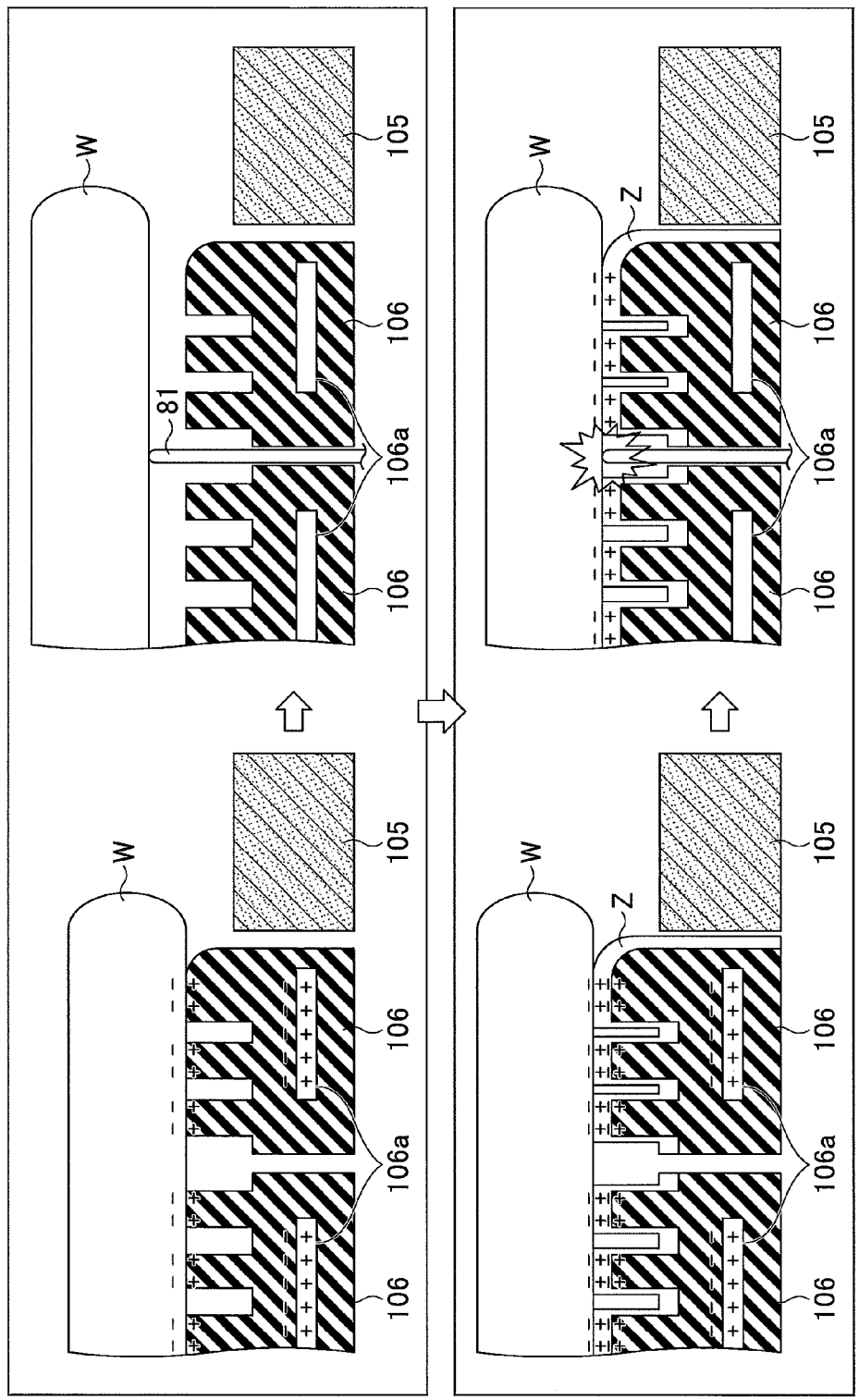
FIG. 2 illustrates generation of a residual charge at an electrostatic chuck according to an embodiment of the present invention.

In the following, a residual charge generated by a state change in the electrostatic chuck surface resulting from a plasma process is described with reference to FIG. 2. The upper diagram of FIG. 2 illustrates a charge state of the electrostatic chuck surface in a case where a plasma process has not been performed or a plasma process has only been performed for a relatively short period of time at the electrostatic chuck 106. The lower diagram of FIG. 2 illustrates a charge state of the electrostatic chuck surface in a case where residual products Z are adhered to the electrostatic chuck 106 as a result of performing a plasma process for a relatively long period of time.

First, the case where a plasma process has not been performed or a plasma process has only been performed for a relatively short period of time at the electrostatic chuck 106 as illustrated by the upper diagram of FIG. 2 is described. The electrostatic chuck 106 has the chuck electrode 106*a* made of a conductive sheet interposed between dielectric members. In a plasma process, the wafer W is attracted to the electrostatic chuck 106 by a Coulomb force that is generated by applying a voltage from the DC voltage source 112 to the chuck electrode 106*a*, and the wafer W is subject to an etching process. During this time, a heat transfer gas (He) is supplied between the backside surface of the wafer W and the surface of the electrostatic chuck 106.

After the etching process, voltage application to the chuck electrode 106a is stopped to de-chuck the wafer W from the electrostatic chuck 106. At this time, an inert gas is introduced into the chamber C to maintain the pressure to a predetermined pressure, and the high frequency power for plasma generation is applied to generate a weak plasma. In such a state, the voltage application to the chuck electrode 106 is stopped and a plasma discharge process is performed for discharging a charge residing in the electrostatic chuck 106 and the wafer W. After the plasma discharge process, the support pins 81 are raised to lift the wafer W from the electrostatic chuck 106, and in this way, the wafer W may be de-chucked from the electrostatic chuck 106.

However, as illustrated in the lower diagram of FIG. 2, when a plasma process is performed for a long period of time, deposits adhere to the surface of the electrostatic chuck 106 and an insulating layer of the residual products Z is formed. In this case, an electric charge is accumulated in the insulating layer such that even when the voltage application to the chuck electrode 106a is stopped, the electric charge accumulated in the insulating layer remain on the surface of the electrostatic chuck 106. The residual charge is difficult to remove even when the above discharge process is performed. As a result, the support pins 81 may be raised while an electrostatic attraction force remains due to the residual charge, and the wafer may be prone to cracking or misalignment.

Particularly, in a case where a convex shaped protrusion is formed on the surface of the electrostatic chuck 106, the residual product Z is deposited on the surface of the protrusion of the electrostatic chuck 106. In relation to an oxide film on the backside surface of the wafer W, the surface of the protrusion becomes the region where a charge is accumulated, and in some cases the region may be approximately half the area of the backside surface of the wafer W. Thus, a charge is accumulated at a higher density in the electrostatic chuck 106 in a case where a protrusion is formed on the surface of the electrostatic chuck 106 as compared with the case where a protrusion is not formed on the surface of the electrostatic chuck 106.

Figure 3:
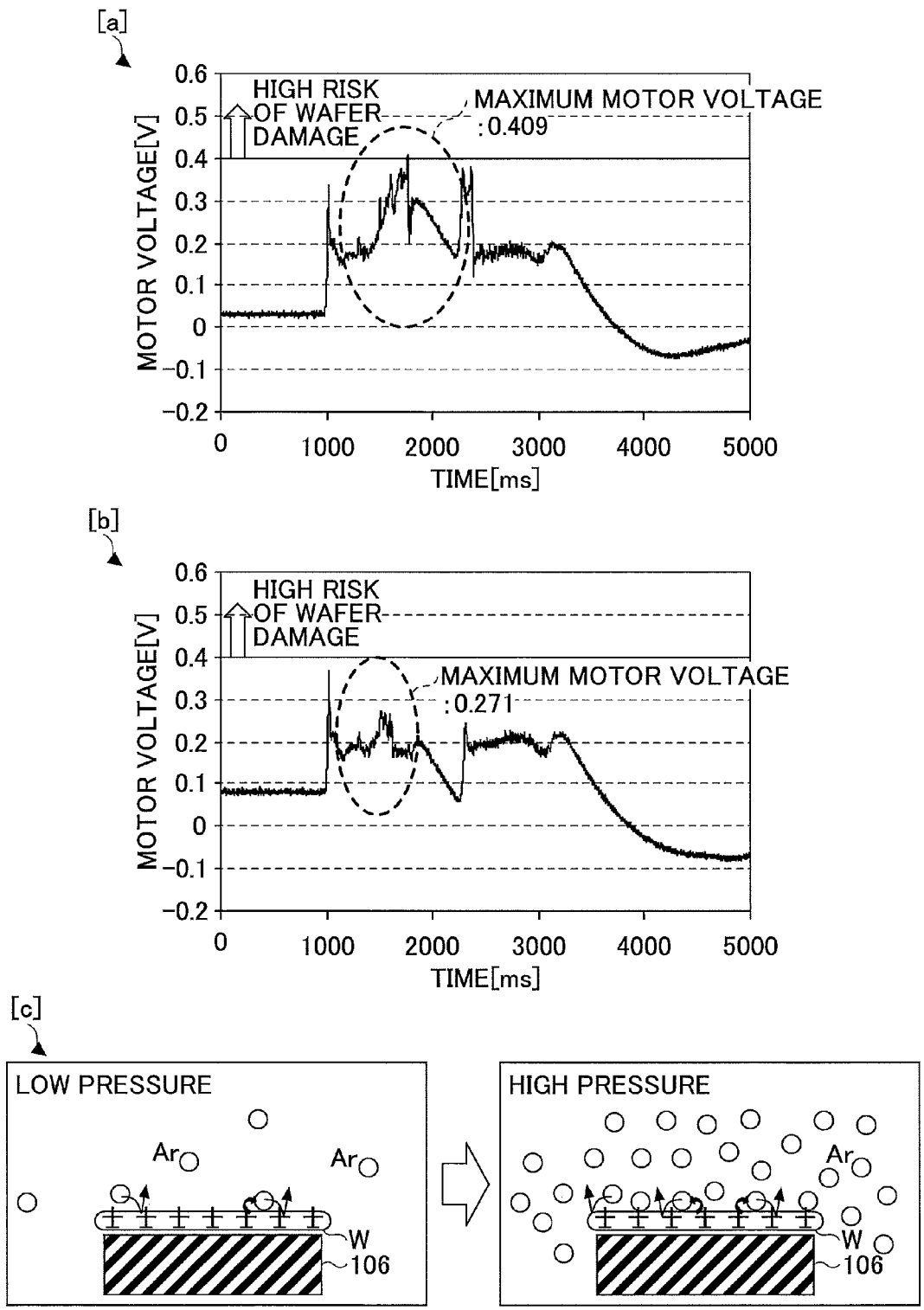
FIG. 3 illustrates a residual charge effect of a high pressure step according to an embodiment of the present invention.

On the other hand, the plasma to be used in the plasma discharge process is a plasma generated by a high frequency power that is low enough to be incapable of etching the wafer W. Thus, oftentimes, the amount of ions and electrons contributing to the discharge process is not an adequate amount for neutralizing the accumulated charge. As a result, in the case where a residual charge is accumulated at a higher density at the backside surface of the wafer W, the residual charge may not be adequately removed. When the wafer W is lifted by the support pins 81 in the presence of such residual attraction, the torque value of the motor 84 that drives the support pin 81 may increase. That is, the torque value may be an indicator of the attraction force attracting the wafer W to the electrostatic chuck 106. Further, the torque value is proportional to the voltage applied to the motor 84. Accordingly, the state of the attraction force may be determined by monitoring the voltage of the motor 84. For example, according to the motor specification used in the present embodiment, if the motor voltage upon lifting the wafer W reaches approximately 0.4 V or greater in the plasma discharge process, the likelihood of causing physical damage such as cracking or chipping of the wafer W increases. In this way, a state of a wafer W in a semiconductor manufacturing apparatus may be empirically derived based on the motor voltage. In a conventional plasma discharge process as illustrated in FIG. 3 [a], the maximum motor voltage is about 0.409 V. Thus, the possibility of the wafer W being damaged is quite high.

[High Pressure Step/Gas Type]

In a wafer de-chuck control method according to the present embodiment, rather than introducing helium gas, which is conventionally used as a heat transfer gas, a gas having a lower ionization energy (gas having a low ionization voltage) than helium gas is introduced between the surface of the electrostatic chuck 106 and the backside surface of the wafer W, and the pressure within this space is increased to a high pressure. FIG. 27 is a chart indicating the ionization energy of atoms, and column "I" of this chart indicates the energy required to take away one electron from the outermost shell of a neutral atom (Physics Dictionary Editorial Board, Physics Dictionary, Baifukan Co., Ltd.).

An electron is more easily exchanged in a gas having a low ionization energy (low ionization potential). Thus, in the present embodiment, a gas having a lower ionization energy than helium gas is adequately supplied between the surface of the electrostatic chuck 106 and the backside surface of the wafer W, and in this way, electron exchange may be promoted between the supplied gas having a low ionization energy and the residual charge residing between the surface of the electrostatic chuck 106 and the backside surface of the wafer W.

FIG. 3 [c] is a conceptual diagram illustrating a case where argon gas (Ar) is supplied as an example of a gas having a lower ionization energy than helium gas. After plasma discharge, argon gas is supplied to create a high-pressure state in which the space between the surface of the electrostatic chuck 106 and the backside surface of the wafer W is filled with argon gas. In this way, electron exchange between the residual charge and the argon gas is promoted, and the residual charge may thereby be discharged. As illustrated in FIG. 3 [c], a charge exchange through argon gas may be further promoted between a deposit film on the electrostatic chuck surface and the wafer backside surface under a high pressure gas state as compared to a low pressure gas state. In this way, the residual charge remaining at the surface layer of the electrostatic chuck 106 may be discharged via a gas having a lower ionization energy than helium gas, and the motor voltage may be lowered such that the likelihood of damage to the wafer W may be reduced.

FIG. 3 [b] illustrates experimental results of performing a process referred to as "high pressure step" after the plasma discharge process. The high pressure step involves introducing argon gas and maintaining the pressure between the wafer backside surface and the surface of the electrostatic chuck 106 to a higher pressure than the pressure during the plasma process. According to the experimental results, the maximum value of the motor voltage was approximately 0.271 V. This value is less than the threshold value 0.4 V for determining the likelihood of damage to the wafer W. Thus, it can be appreciated from these experimental results that after performing the high pressure step, the wafer W may be reliably de-chucked from the electrostatic chuck 106. That is, by supplying a gas having a lower ionization energy than helium gas and increasing the pressure between the wafer backside surface and the electrostatic chuck 106 surface after plasma discharge, the torque at the time of lifting the support pins 81 may be reduced. In this way, the wafer W can be safely de-chucked from the electrostatic chuck 106 without being damaged.

Figure 4:
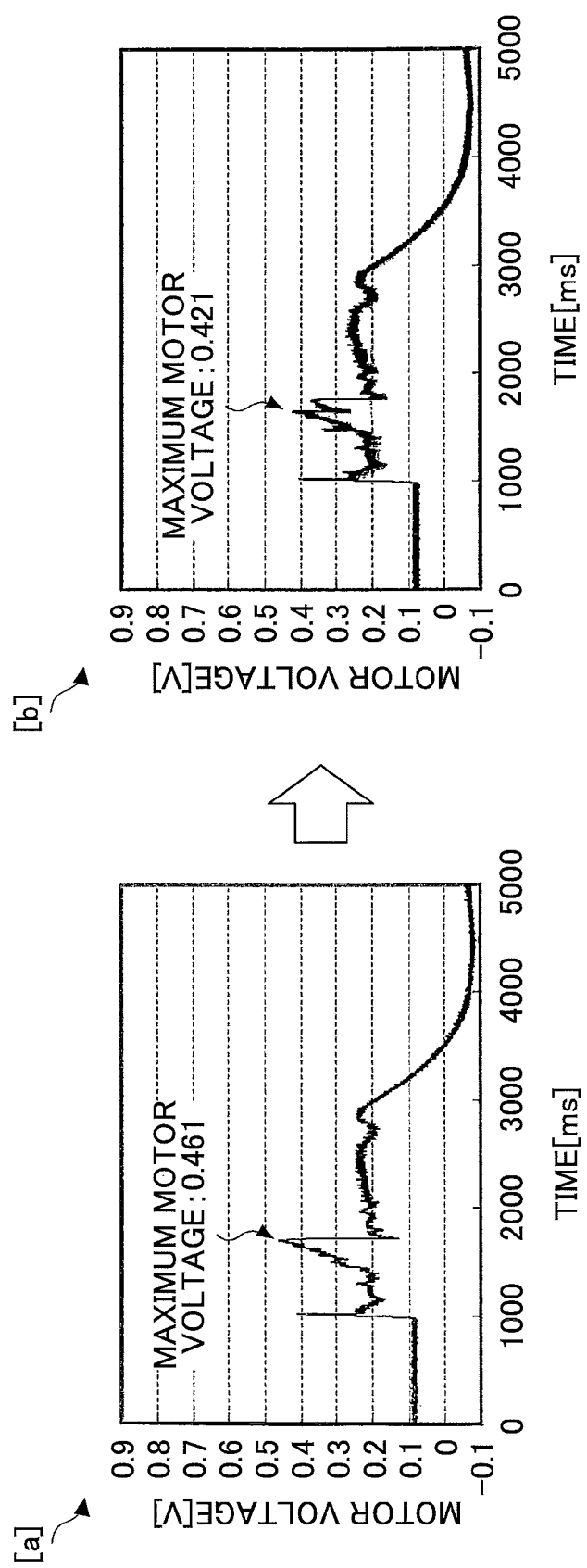
FIG. 4 illustrates a residual charge effect depending on the gas used in a high pressure step according to an embodiment of the present invention.

FIG. 4 [a] and FIG. 4 [b] illustrate experimental results of the motor voltage obtained when helium gas, which is generally used as a heat transfer gas, was introduced between the wafer W backside surface and the electrostatic chuck 106 surface. In FIG. 4 [a], a high pressure step of increasing the pressure between the wafer W backside surface and the electrostatic chuck 106 surface to a higher pressure than the pressure during a plasma process is not performed, but in FIG. 4 [b], the high pressure step is performed.

According to the experimental results, in FIG. 4 [a], the maximum motor voltage was 0.461 V, whereas in FIG. 4 [b], the maximum motor voltage was 0.421 V. It can be appreciated from the above that in the case where helium gas is introduced, there is no substantial change in the motor voltage regardless of whether the high-pressure step is performed. That is, in both cases, the maximum motor voltage was above the threshold value 0.4 V for determining the likelihood of damage to the wafer W. Therefore, in both cases, the likelihood of damage to the wafer W damage is substantially high.

Referring to the chart of FIG. 27, the ionization energy for neutral atoms of helium gas ("I") is about 24.6, and the exchange of electrons at the outermost shell of helium atoms does not occur easily enough to contribute to the movement of the residual charge. Therefore, an atom having a lower ionization energy than helium gas has to be supplied in a high pressure step. According to the chart in FIG. 27, examples of atoms having a lower ionization energy than helium gas include argon (15.7), nitrogen (14.5), and oxygen (13.6).

[Functional Configuration of Control Device]

Figure 5:
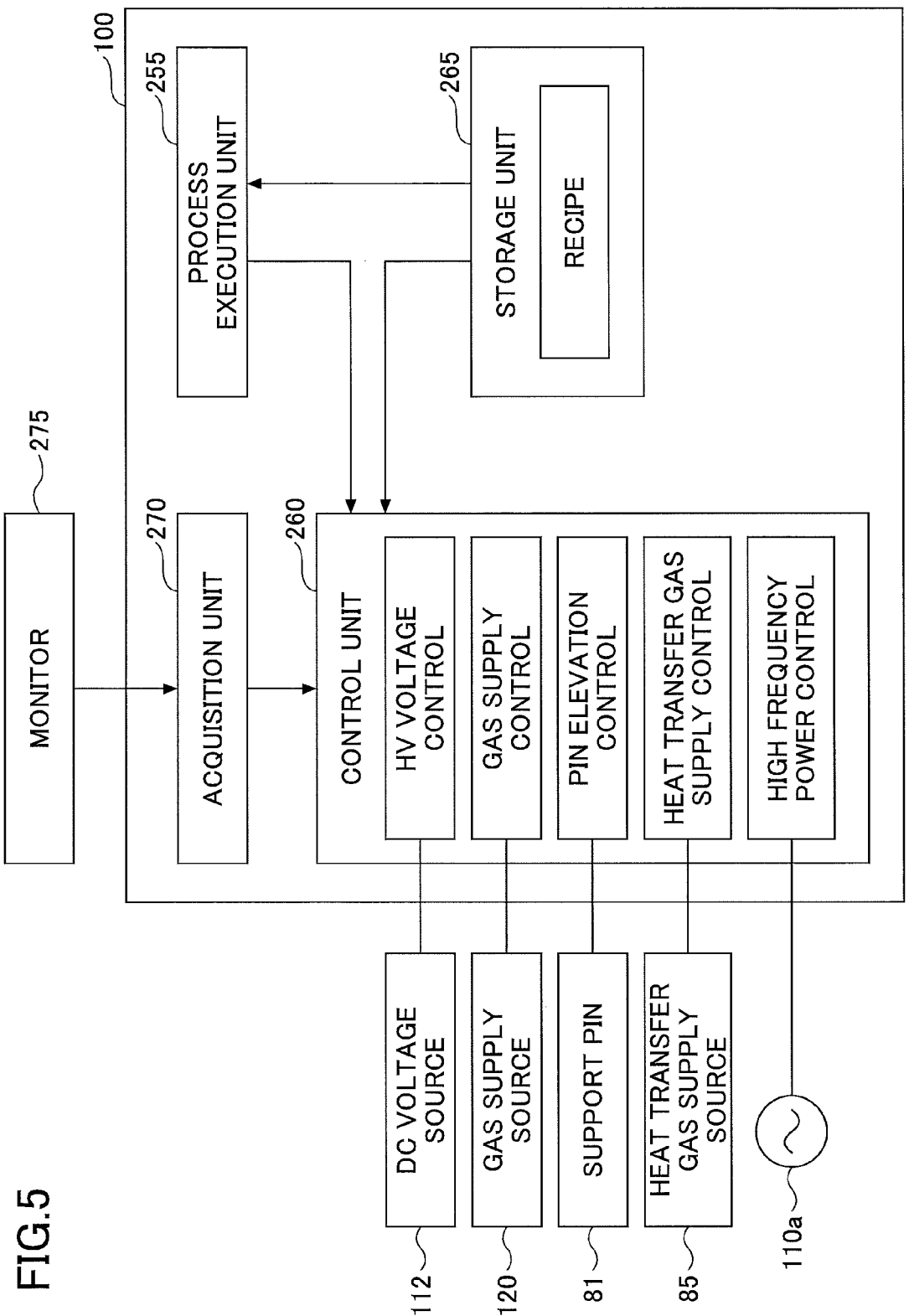
FIG. 5 is a block diagram illustrating a functional configuration of a control unit according to an embodiment of the present invention.

In the following, a functional configuration of the control device 100 for controlling processes including the discharge process is described with reference to FIG. 5. The control device 100 includes a process execution unit 255, a control unit 260, a storage unit 265, and an acquisition unit 270.

In the storage unit 265, a plurality of process recipes for performing etching processes are stored. The process execution unit 255 selects a desired etching process from the plurality of recipes stored in the storage unit 265 and controls an etching process according to the selected recipe. The etching process may be performed using the etching apparatus as illustrated in FIG. 1.

The control unit 260 controls the components of the etching apparatus 10. Note that in the following, control operations of the control unit 26 relating to de-chucking operations with respect to the electrostatic chuck 106 are described. To control de-chucking operations with respect to the electrostatic chuck 106, the control unit 260 controls the voltage of the DC voltage source 112, the gas supplied to the chamber C by the gas supply source 120, the elevation of the support pins 81, and the heat transfer gas supplied to the backside surface of the wafer W by the heat transfer gas supply source 85. Also, the control unit 260 controls the high frequency power source 110a to control application of a high frequency power for plasma discharge. The control unit 260 also performs exhaust control of the exhaust device 173.

The storage unit 265 may be implemented by a RAM and a ROM using a semiconductor memory, a magnetic disk, or an optical disc, for example. The recipes may be stored in a storage medium and loaded into the storage unit 265 via a driver (not shown), for example. Also, the recipes may be downloaded to the storage unit 265 via a network (not shown). Also, in some embodiments, a DSP (Digital Signal Processor) may be used instead of the CPU to implement the functions of the control unit 260. The functions of the control unit 260 may be implemented by software, hardware, or a combination thereof.

A monitor 275 monitors the voltage of the electrostatic chuck 106 for at least 10 seconds after a predetermined time elapses for stabilizing the pressure within the chamber C to a steady state (monitoring step). The acquisition unit 270 acquires a detection value of the monitoring result. The above is a description of the functional configuration of the control device 100 according to an embodiment of the present invention.

[De-Chuck Control Method]

Figure 6:
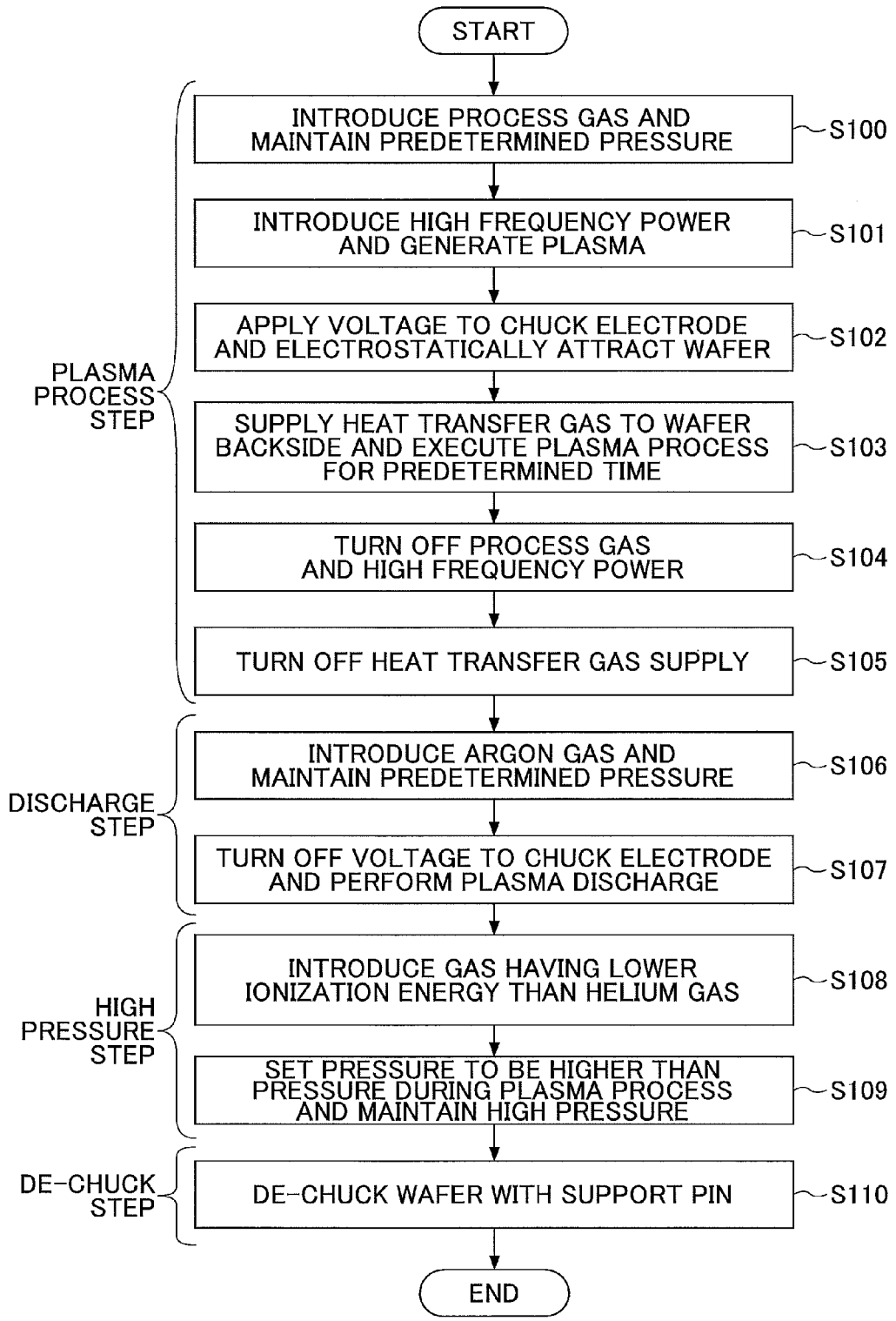
FIG. 6 is a flowchart illustrating a de-chuck control method according to an embodiment of the present invention.
Figure 7:
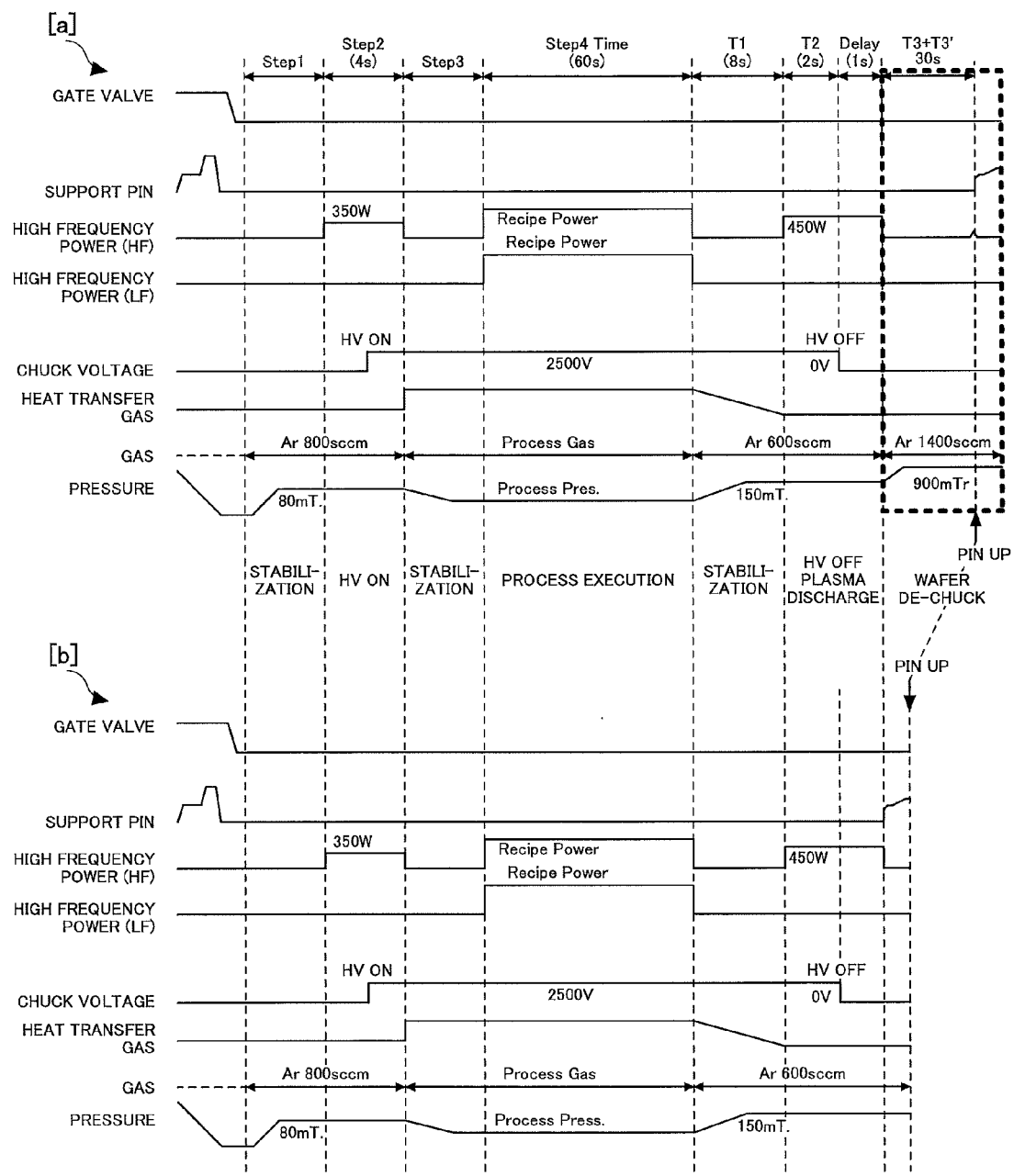
FIG. 7 is a time chart illustrating a de-chuck control method according to an embodiment of the present invention and a de-chuck control method according to a comparative example.

In the following, a de-chuck control method according to the present embodiment is described with reference to FIGS. 6 and 7. FIG. 6 is a flowchart illustrating a de-chuck control method for de-chucking the wafer W according to the present embodiment. FIG. 7 [a] is a time chart illustrating the de-chuck control method for de-chucking the wafer W according to the present embodiment. FIG. 7 [b] is a time chart illustrating a de-chuck control method for de-chucking the wafer W according to a comparative example. In the de-chuck control method according to the present embodiment, the wafer W may be safely de-chucked without damage from the electrostatic chuck 106 that electrostatically attracts the wafer W.

A plasma process (etching) step is primarily controlled and executed by the process execution unit 255. A discharge step, a high pressure step, and a de-chuck step are primarily controlled by the control unit 260.

First, the wafer W is loaded into the chamber C, and the plasma process step is performed. A process gas is introduced into the chamber C, and the pressure within the chamber C is maintained at a predetermined pressure (step S100). Note that step 1 of FIG. 7 [a] corresponds to step S100 of FIG. 6, and in the present embodiment, argon gas is supplied at 800 sccm and the chamber pressure is controlled to 80 mTorr (10.6 Pa).

Then, a high frequency power is introduced into the chamber C and a plasma is generated (S101). Note that step 2 of FIG. 7 [a] corresponds to step S101 of FIG. 6, and in the present embodiment, a high frequency power of 350 W (HF) is applied to the lower electrode. Note that in some embodiments, an etching apparatus that is configured to apply a high frequency power (HF) to an upper electrode may be used.

Then, after plasma generation, a voltage is applied to the chuck electrode 106a, and the wafer W is electrostatically attracted to the electrostatic chuck 106 (step S102). Note that step 2 of FIG. 7 [a] also corresponds to step S102 of FIG. 6, and in the present embodiment, a voltage is applied to the chuck electrode 106a in the middle of step 2 (HV ON).

After stabilization, helium gas acting as a heat transfer gas is supplied between the backside surface of the wafer W and the surface of the electrostatic chuck 106, and a plasma process (etching process) is performed for a predetermined process time in this state (step S103). Note that step 3 and step 4 of FIG. 7 [a] correspond to step S103 of FIG. 6, and in the present embodiment, the heat transfer gas is supplied at the start of step 3, and the etching process may be performed in step 4 under various process conditions according to a recipe.

After the plasma process is completed, the supply of the process gas and the supply of the high frequency power are stopped (step S104), and the supply of the heat transfer gas is stopped (step S105). Then, the discharge step is executed. The discharge step is a step of introducing an inert gas into the chamber C after the plasma process to perform a discharge process. In the discharge step, first, argon gas is introduced into the chamber C and the pressure within the chamber is maintained at a predetermined pressure (step S105). Note that time T1 after step 4 of FIG. 7 [a] corresponds to the time during which steps S104-S106 of FIG. 6 are performed. In the present embodiment, the supply of the process gas and the supply of the high frequency power are stopped. While gradually reducing and stopping the supply of the heat transfer gas, argon gas is introduced at 600 sccm and the pressure within the chamber C is controlled to 150 mTorr.

After stabilization, the voltage application to the chuck electrode 106a is stopped (0V), and a discharge process is performed while generating a weak plasma (step S107: plasma discharge). Note that time T2 after step 4 of FIG. 7 [a] corresponds to a time for stabilization, and in the present embodiment, after time T2 elapses, the voltage application to the chuck electrode 106a is stopped (0V) and plasma discharge is performed. Note that processes up to this point are substantially identical in the present embodiment as illustrated in FIG. 7 [a] and the comparative example as illustrated in FIG. 7 [b]. However, the de-chuck control method of the present embodiment as illustrated in FIG. 7 [a] differs from the comparative example as illustrated in FIG. 7 [b] in that a high pressure step is executed as part of a wafer de-chuck step.

Specifically, in the high pressure step illustrated in FIG. 7 [a], after the discharge step, argon gas as an example of gas having a lower ionization energy than helium gas is supplied at a flow rate greater than the flow rate of gas supplied during the discharge step (step S108). The pressure within the chamber C is controlled and maintained at a higher pressure than the pressure during the plasma process step or the pressure during the discharge process step (step S109).

During the high pressure step or after the high pressure step, the de-chuck step of de-chucking the wafer W from the electrostatic chuck 106 with the support pins 81 is performed (step S110), and the present process is ended. In the de-chuck step, the wafer W is preferably de-chucked from the electrostatic chuck 106 by the support pins 81 after the pressure within the chamber C stabilizes to a steady state. In this way, the wafer W may be reliably de-chucked from the electrostatic chuck 106 without causing damage to the wafer W. In the present embodiment, the chamber pressure is controlled to a high pressure of 900 mT, argon gas is supplied at 1400 sccm, and after such a state is maintained for 30 seconds, the wafer W is de-chucked by the support pins 81.

As described above, the flow rate of the argon gas introduced during the high pressure step is preferably controlled to be greater than the flow rate of the argon gas supplied during the discharge step. In this way, charge exchange between the insulating layer Z on the surface of the electrostatic chuck 106 and the wafer W backside surface may be further facilitated. Also, by increasing the gas flow rate, the pressure within the chamber C can be quickly controlled to a high pressure.

In contrast, in the de-chuck step for de-chucking the wafer in the comparative example, process conditions during the plasma discharge step is largely retained while the wafer W is de-chucked by the support pins, and the chamber C is not controlled to a high pressure when the wafer is detached.

[Example Effects]

Figure 8:
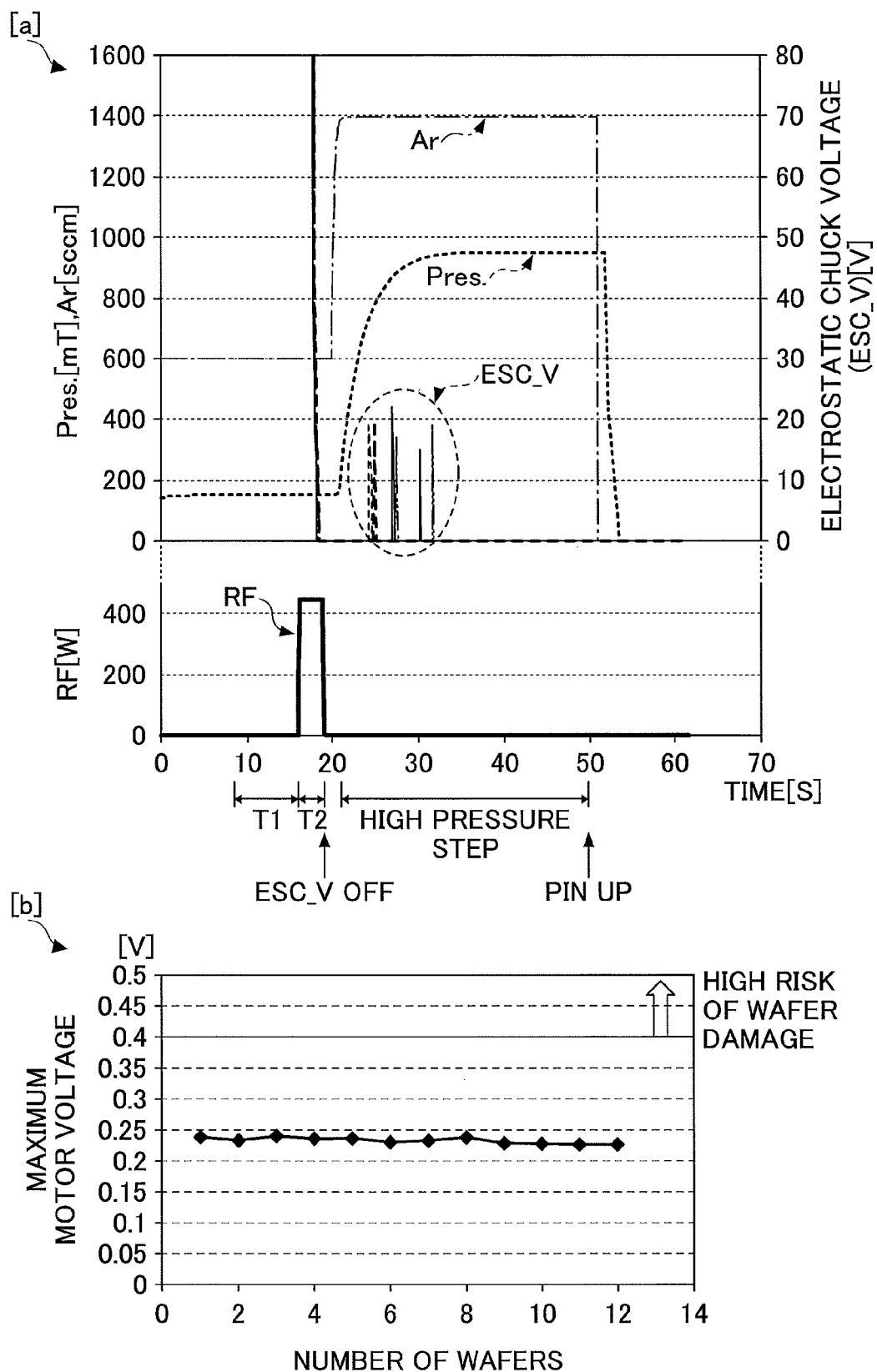
FIG. 8 illustrates a voltage deflection in the electrostatic chuck when the high pressure step according to an embodiment of the present invention was performed on four wafers.
Figure 9:
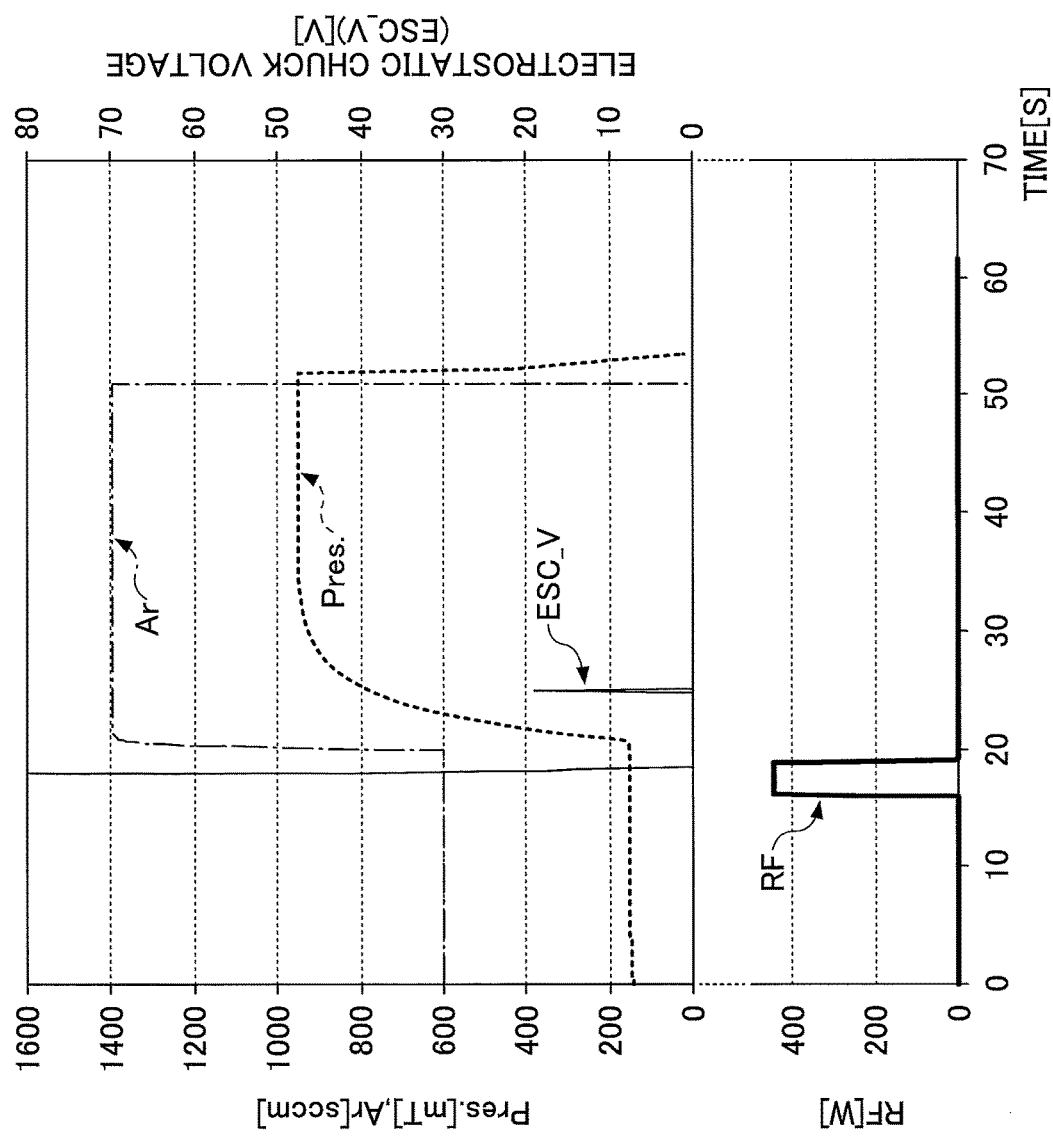
FIG. 9 illustrates a voltage deflection in the electrostatic chuck for the first wafer of the wafers processed in FIG. 8.
Figure 10:
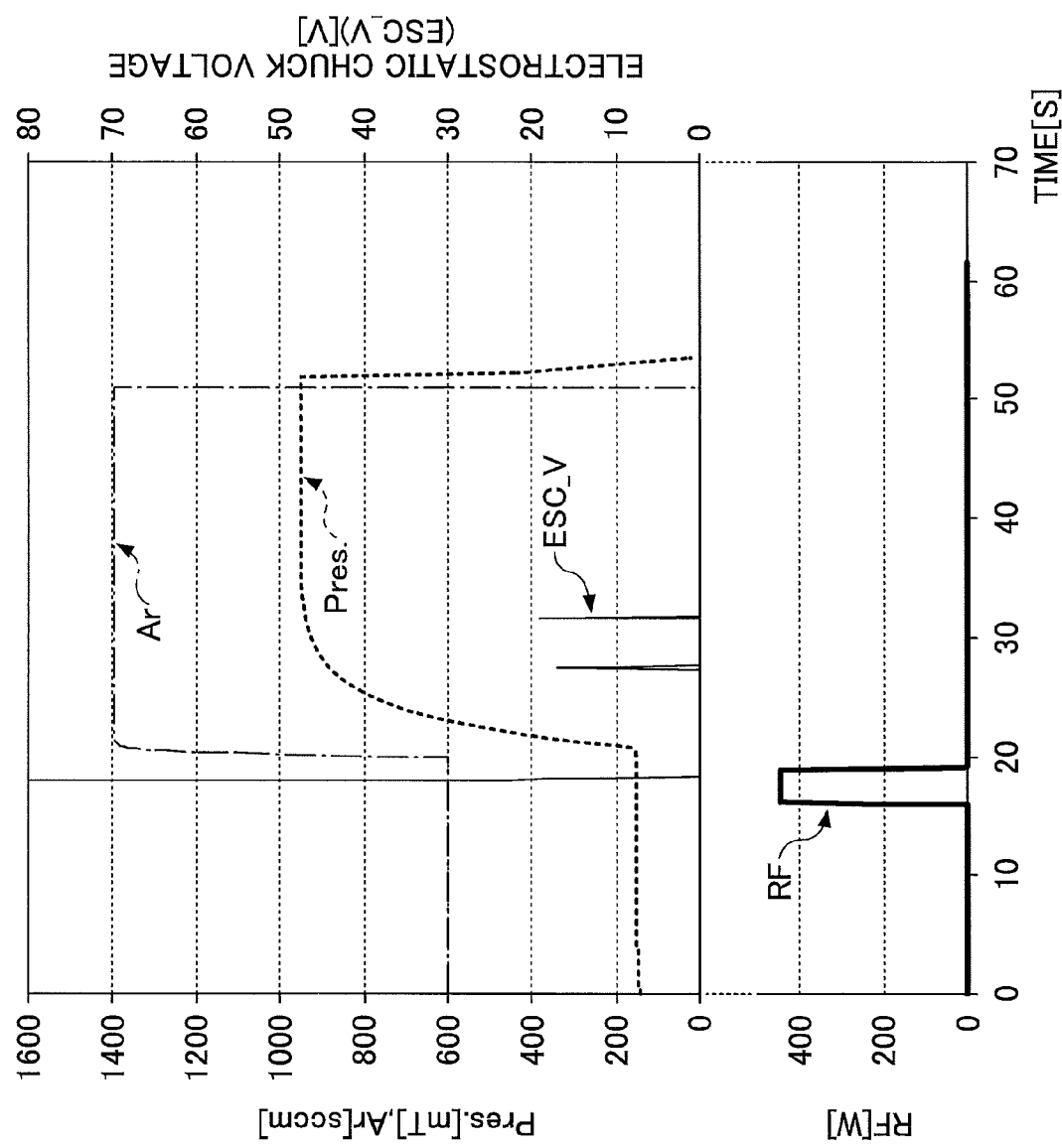
FIG. 10 illustrates a voltage deflection in the electrostatic chuck for the second wafer of the wafers processed in FIG. 8.
Figure 11:
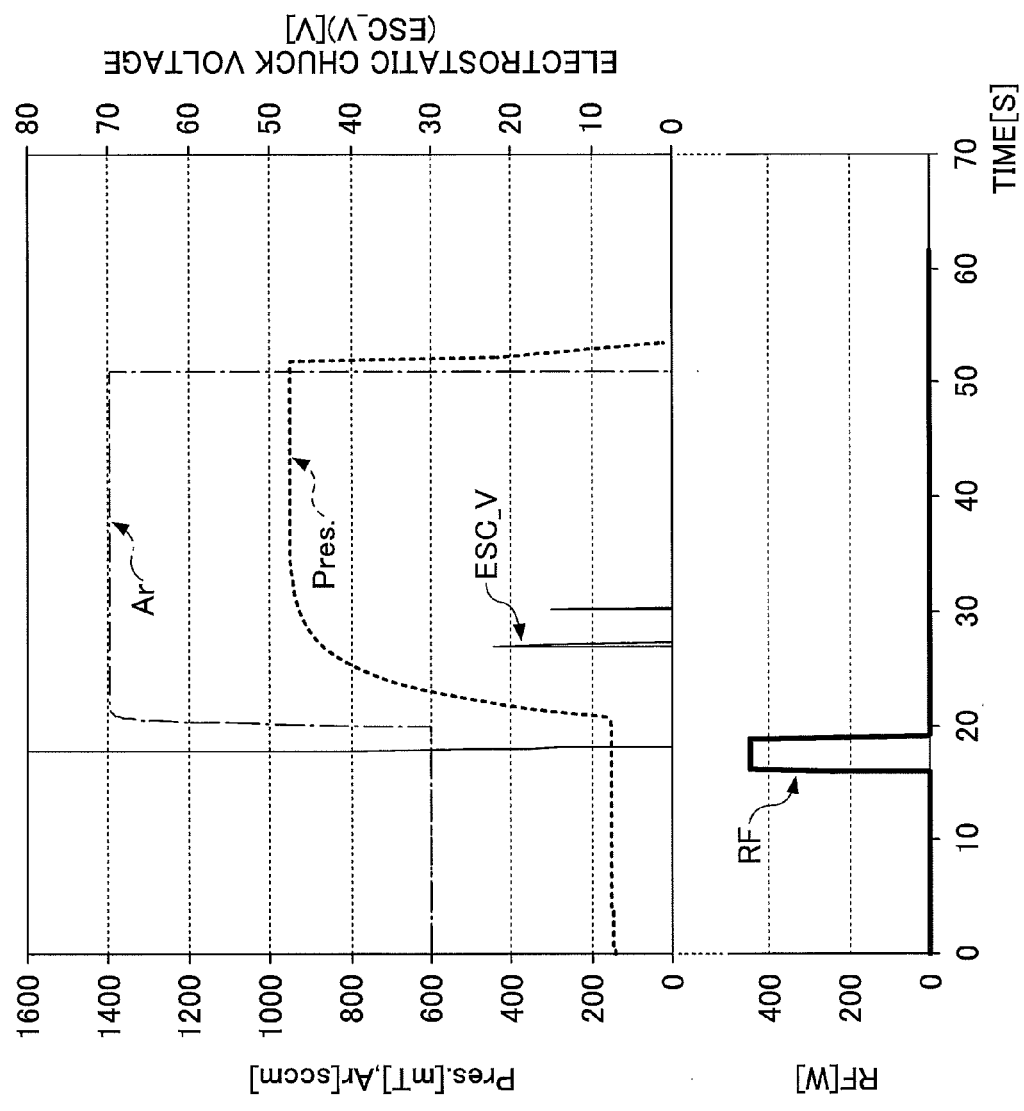
FIG. 11 illustrates a voltage deflection in the electrostatic chuck for the third wafer of the wafers processed in FIG. 8.
Figure 12:
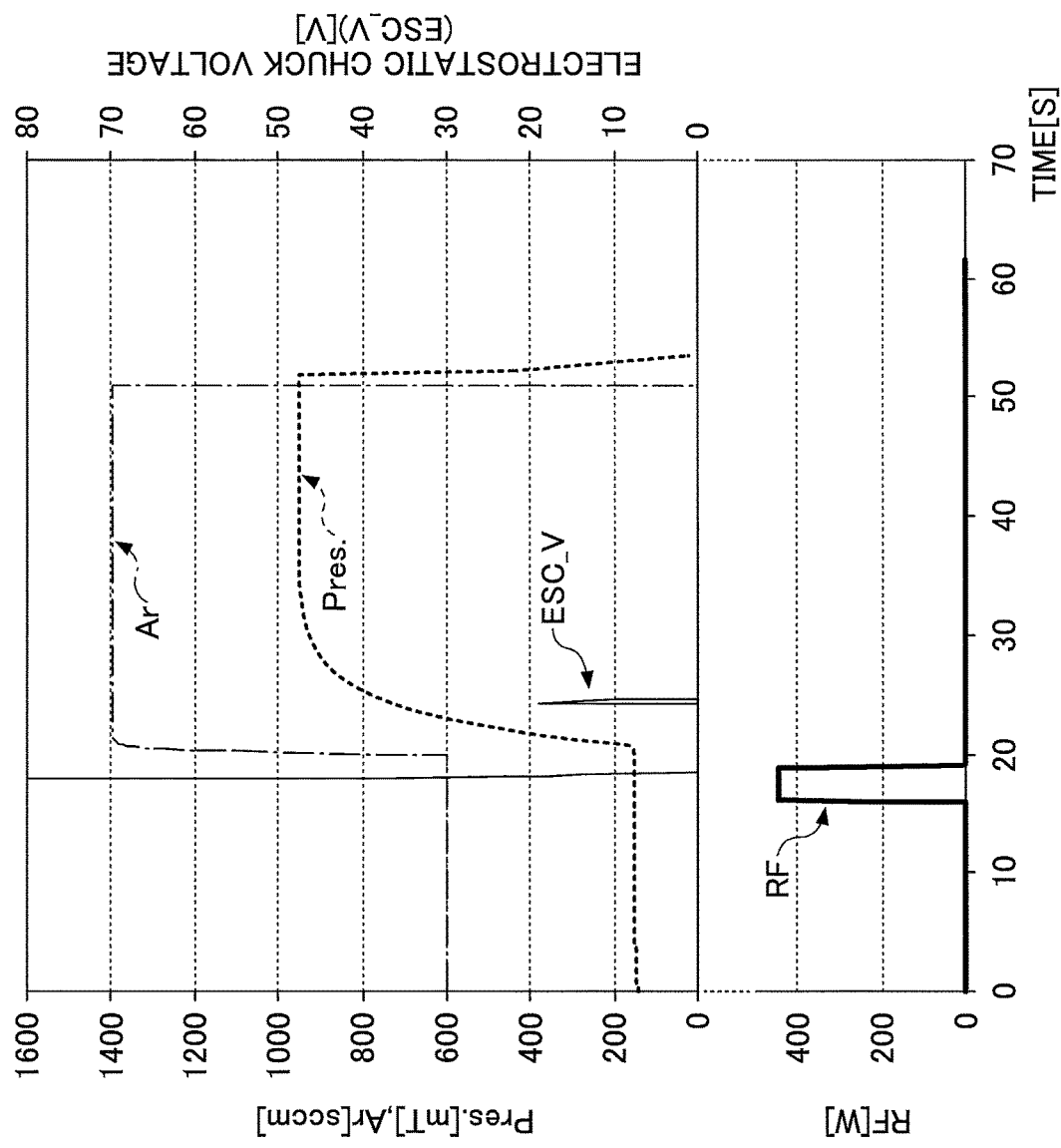
FIG. 12 illustrates a voltage deflection in the electrostatic chuck for the fourth wafer of the wafers processed in FIG. 8.

In the following, exemplary effects of the de-chuck control method of the present embodiment are described. FIG. 8 illustrates deflections of the electrostatic chuck voltage in the high pressure step according to an embodiment of the present invention. FIG. 8 [a] illustrates the high frequency power for plasma generation RF (W), the voltage of the electrostatic chuck ESC_V (V), the pressure within the chamber Pres. (mT), and the argon gas Ar (sccm) during the process times corresponding to T1 (8 s)→T2 (2 s)→Delay (1 s)→high pressure step (T3+T3' (30 s)) in the time chart of FIG. 7. Also, referring to FIG. 8 [b] illustrating experimental results of performing the de-chuck control method of the present embodiment on at least 10 wafers, it can be appreciated that a maximum motor voltage generated upon de-chucking a wafer in the de-chuck control method according to the present embodiment is slightly less than 0.25 v. FIG. 8 [a] illustrates the process histories of four wafers selected from the plurality of wafers that have been subject to the experiments. Further, FIGS. 9-12 respectively illustrate the process histories of the first wafer, the second wafer, the third wafer, and the fourth wafer of the four wafers illustrated in FIG. 8 [a].

After time T2 elapses, the pressure is controlled to a high pressure of 900 mT, argon gas is supplied at 1400 sccm, and a high pressure step of maintaining such a state for 30 seconds is performed. As a result, even when the voltage (ESC_V) applied to the electrostatic chuck 106 is stopped (0 V) after time T2 elapses, deflections occur in the voltage of the electrostatic chuck 106 in the high pressure step in all of the wafers. Note that such deflections are represented by the voltage ESC_V within the dashed oval in FIG. 8 [a] and the voltages ESC_V of the electrostatic chuck 106 illustrated in FIGS. 9-12. These results may correspond to the detection of movement of the residual charge caused by the introduction of argon gas having a low ionization energy to realize a high pressure state as illustrated in FIG. 3 [c]. That is, by supplying argon gas having a low ionization energy, charge exchange between the insulation layer Z of the electrostatic chuck 106 and the wafer W backside surface may be further facilitated. In this way, the residual charge on the surface of the electrostatic chuck 106 may be reduced. As can be appreciated from the above, by executing the high pressure step, the risk of damage to the wafer can be reduced.

[High Pressure Step/Pressure]

Figure 13:
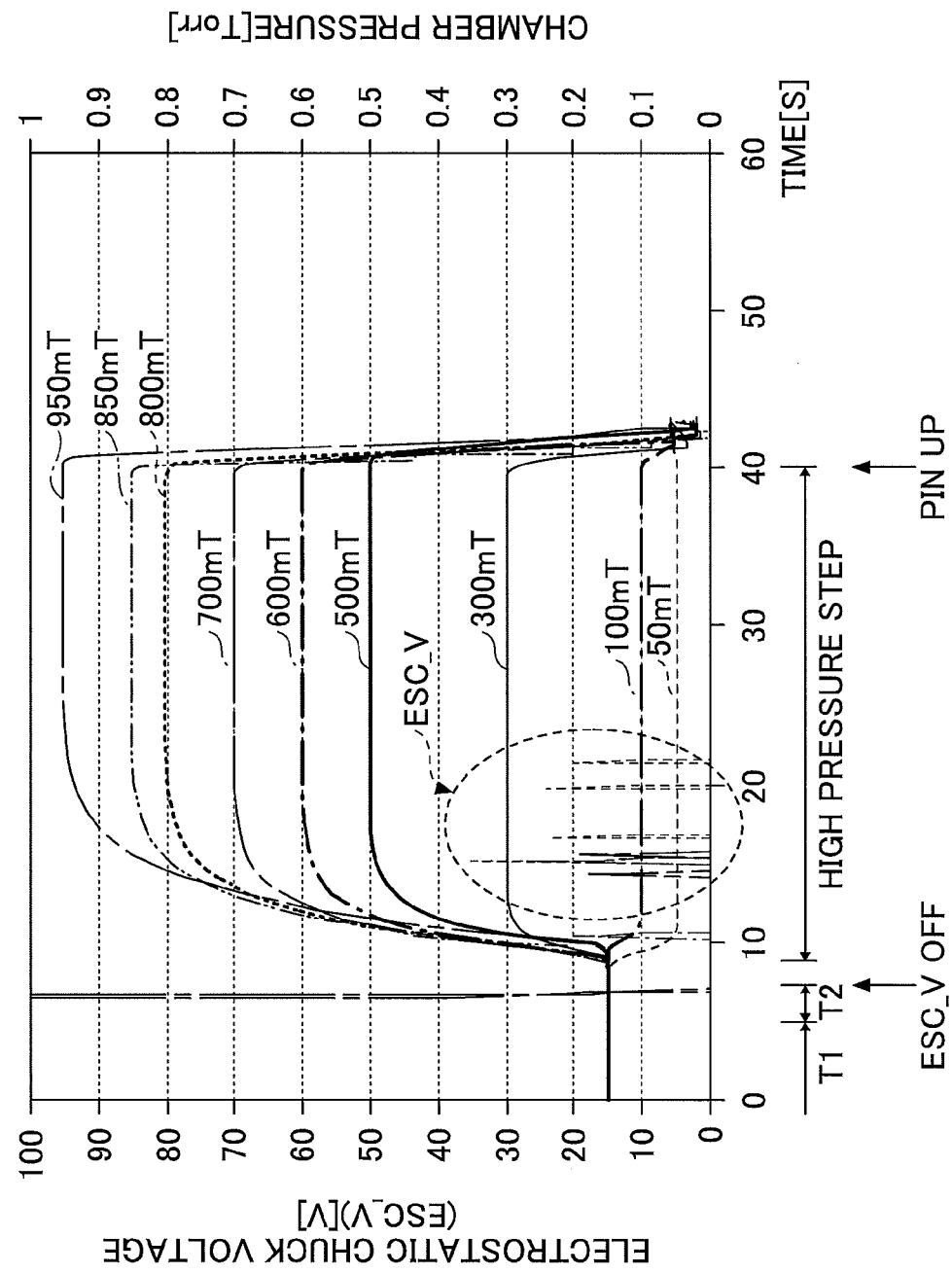
FIG. 13 illustrates the pressure and the electrostatic chuck voltage in a high pressure step according to an embodiment of the present invention.

In the following, experimental results relating to pressure dependence of the high pressure step are described with reference to FIG. 13. FIG. 13 illustrates the voltage of the electrostatic chuck 106 depending on the pressure in the high pressure step according to the present embodiment.

The chamber pressure in the high pressure step was controlled to 50 mT, 100 mT, 300 mT, 500 mT, 600 mT, 700 mT, 800 mT, 850 mT, and 950 mT in the present experiment. FIG. 13 illustrates the process histories of the high frequency power (HF), the electrostatic chuck voltage, the chamber pressure (variable), and argon gas during the process times T1 (8 s)→T2 (2 s)→Delay (1 s)→high pressure step.

According to these results, even when the voltage application to the electrostatic chuck 106 is stopped (0V) after time T2 elapses, deflections in the voltage of the electrostatic chuck 106 occur in the high pressure step where argon gas is supplied at 1400 sccm and the chamber pressure is controlled to one of the above pressures.

Figure 14:
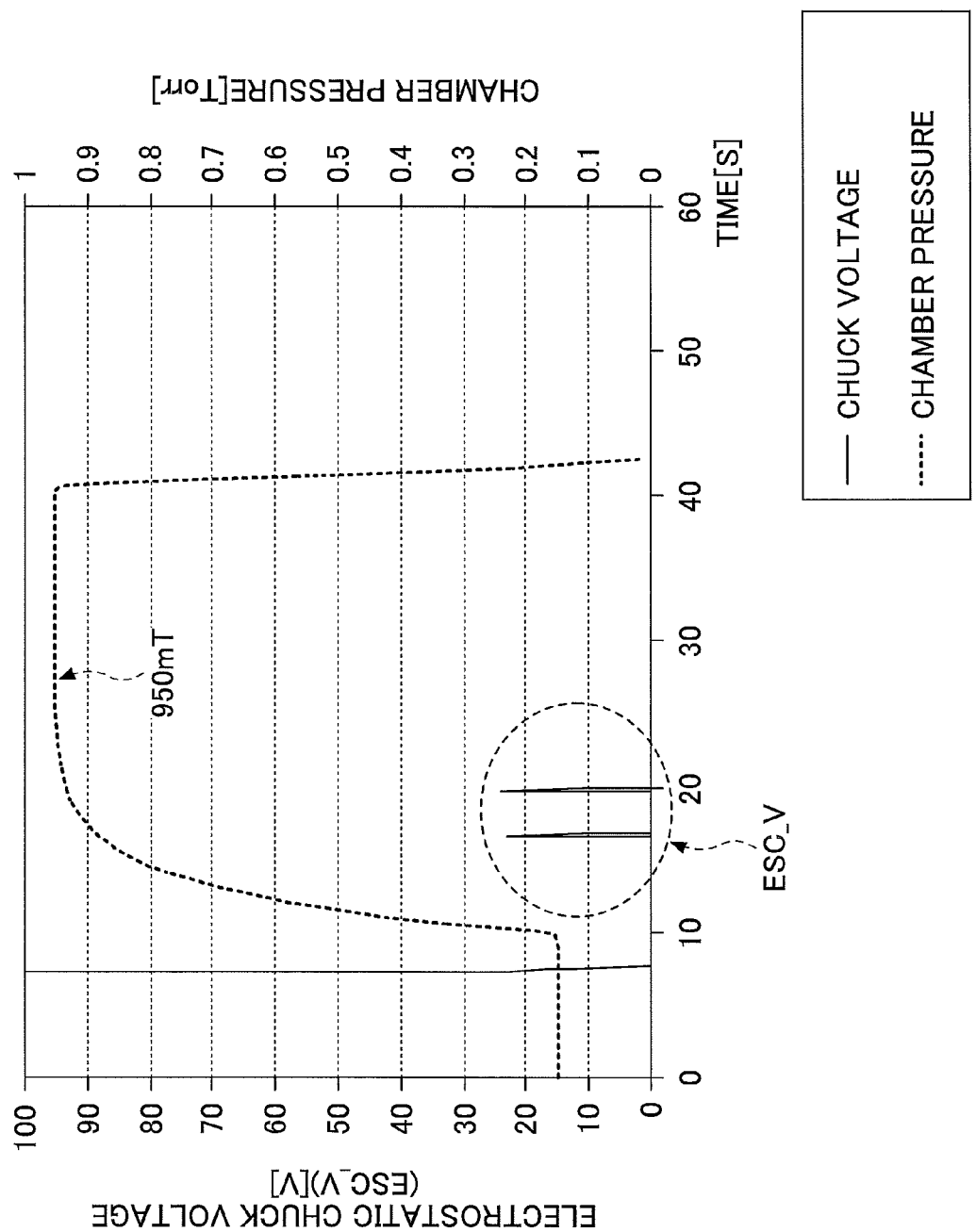
FIG. 14 illustrates the pressure and the electrostatic chuck voltage in a high pressure step according to an embodiment of the present invention.
Figure 15:
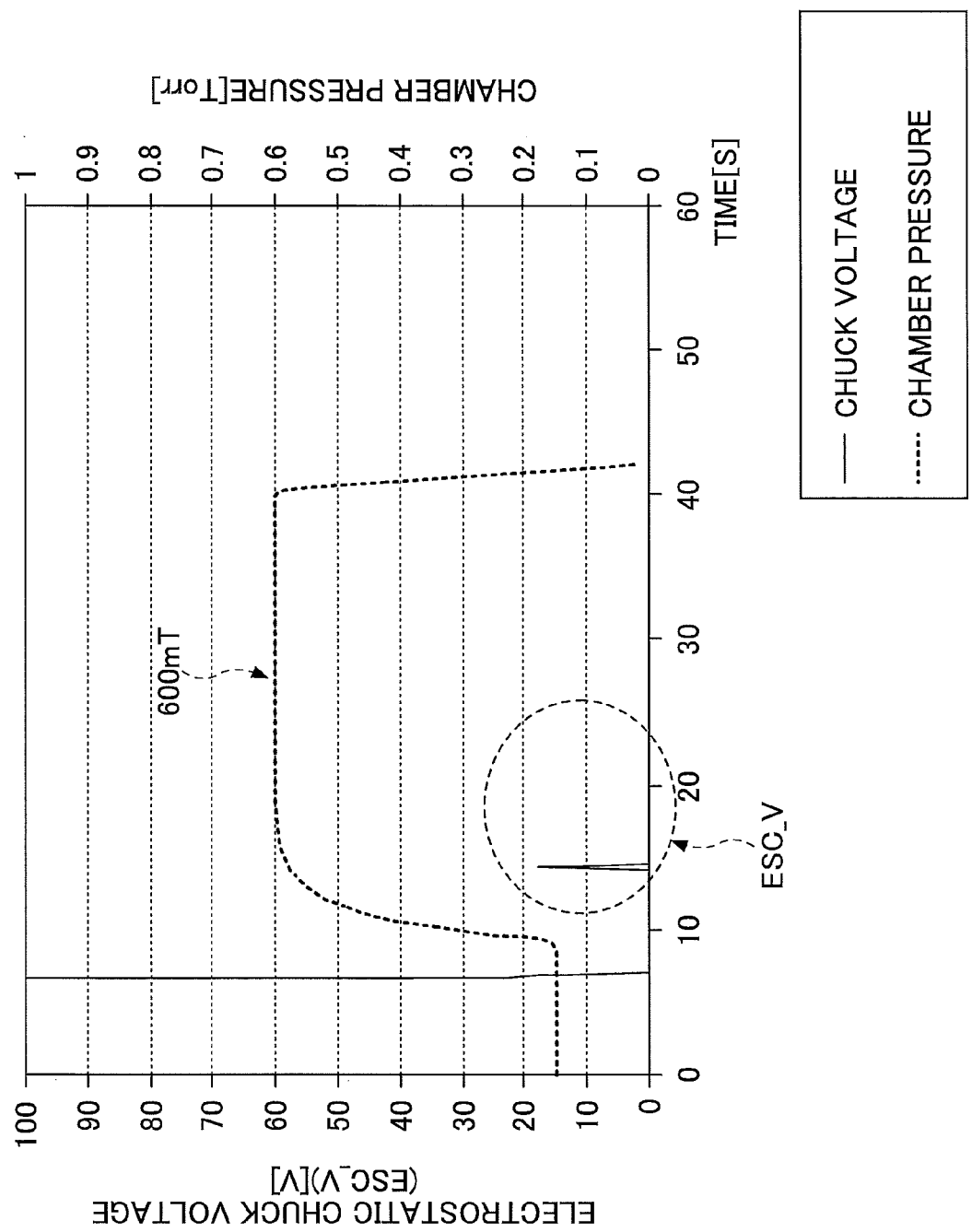
FIG. 15 illustrates the pressure and the electrostatic chuck voltage in a high pressure step according to an embodiment of the present invention.

Specifically, as illustrated in FIG. 14, when the chamber pressure was set to 950 mT, two peaks could be observed in the chuck voltage. As illustrated in FIG. 15, when the chamber pressure was set to 600 mT, one peak could be observed in the chuck voltage. Although not shown, peaks of the chuck voltage could also be observed when the chamber pressure was set to pressures between 600 mT and 950 mT.

Figure 16:
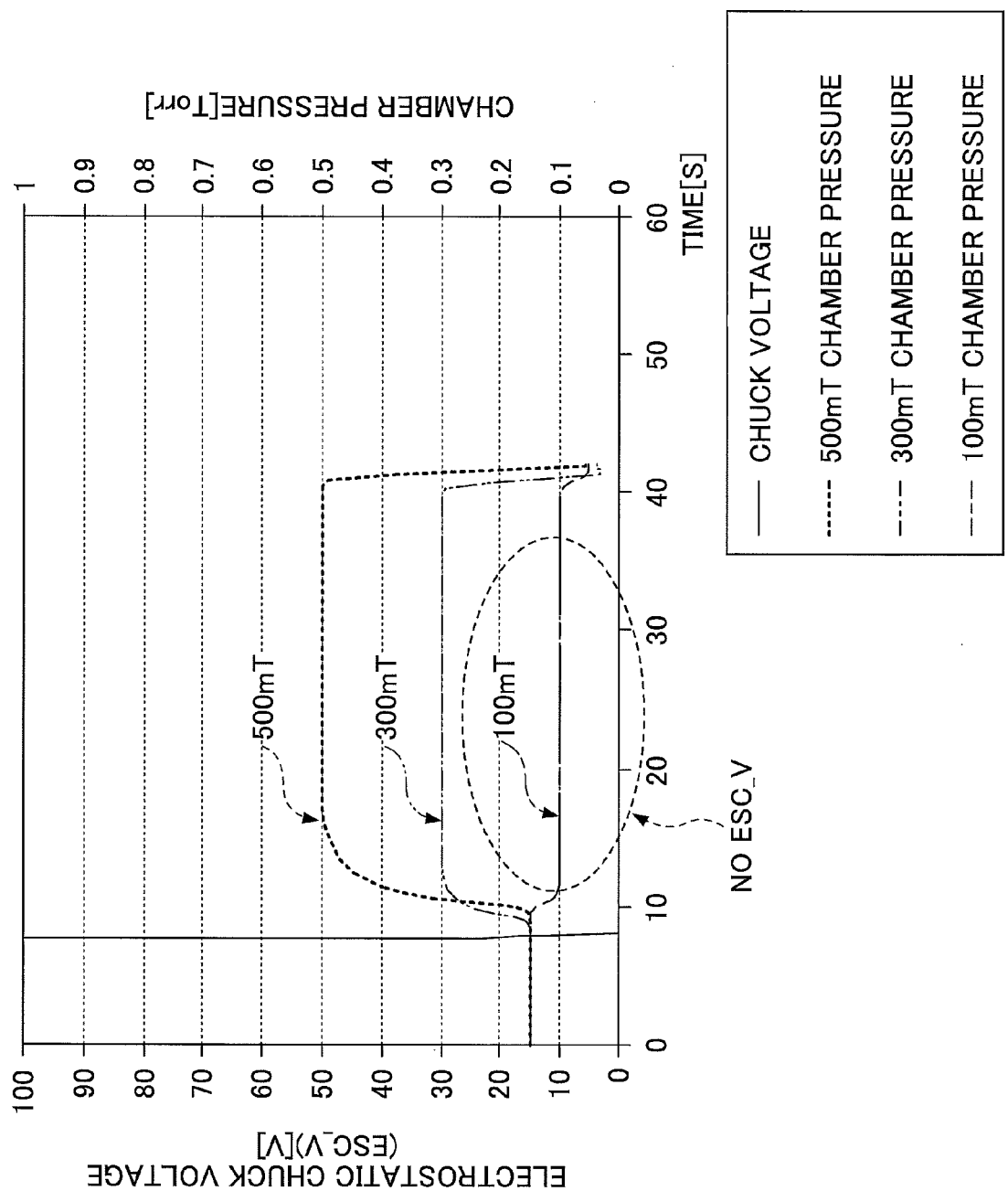
FIG. 16 illustrates the pressure and the electrostatic chuck voltage in a high pressure step according to an embodiment of the present invention.

On the other hand, when the chamber pressure was set to 500 mT or lower, a peak of the chuck voltage could not be observed. For example, in FIG. 16 illustrating cases where the chamber pressure was set to 500 mT, 300 mT, and 100 mT (an illustration of a case of setting the chamber pressure to 50 mT is omitted), no peaks of the chuck electrode could be observed.

It can be appreciated from these results that as the pressure is controlled to a lower pressure, the likelihood of voltage deflections occurring in the electrostatic chuck 106 is reduced, and as the pressure is reduced, movement of the residual charge is reduced. Note that in the case where the chamber pressure was set to 500 mT or lower, no peaks were detected in the voltage of the electrostatic chuck 106.

Further, upon de-chucking the wafer W with the support pins 81 after the high pressure step, the wafer W was cracked when the chamber pressure was set to 100 mT, and splashes on the wafer W could be visually detected when the chamber pressure was set to 300 mT and 500 mT.

It could be appreciated from the above that in the high pressure step, the pressure within the chamber C is preferably controlled to be greater than 500 mT (66.7 Pa).

[High Pressure Step/Pressure and Wafer Surface Potential]

Figure 17:
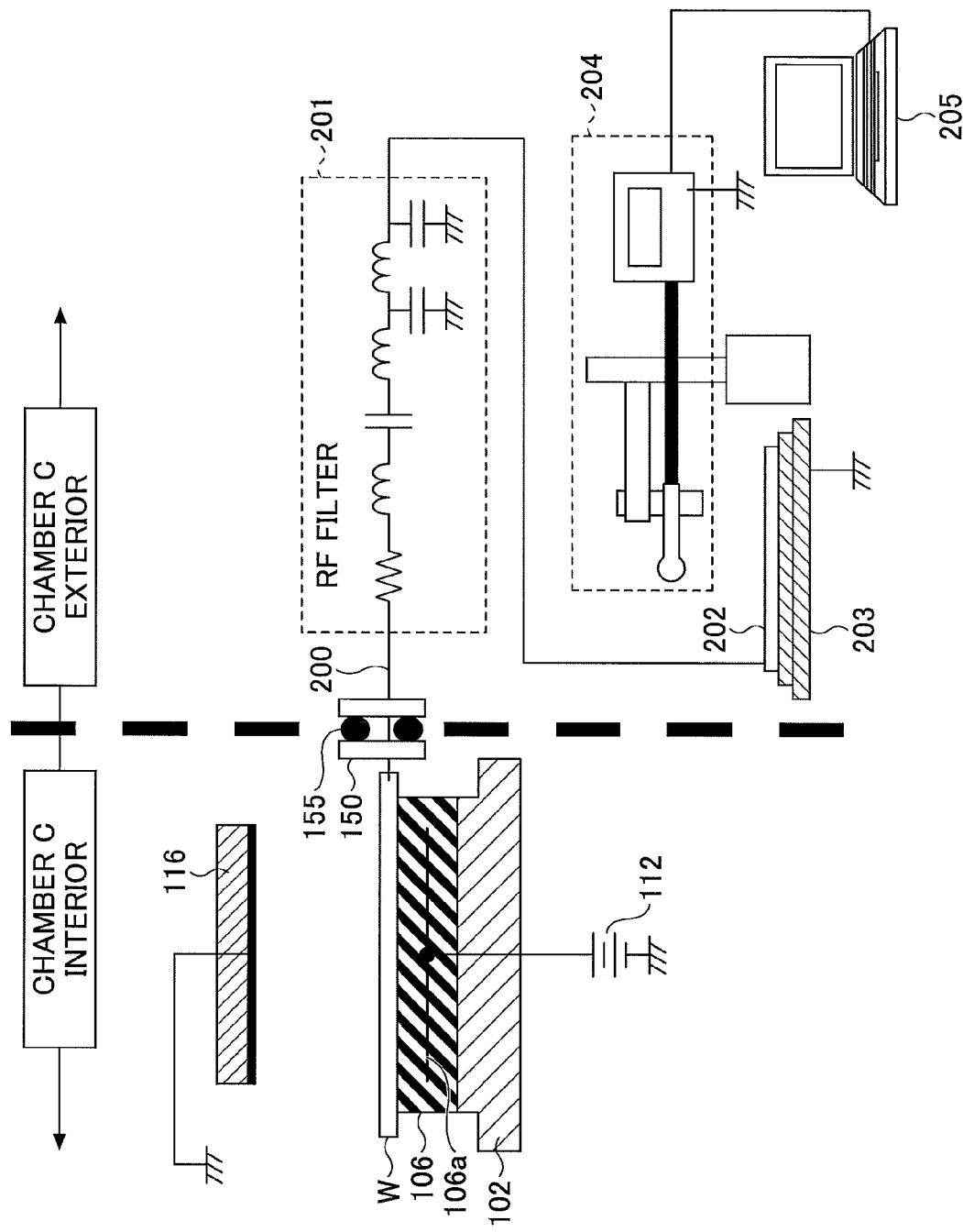
FIG. 17 illustrates a configuration of device for measuring the surface potential of a wafer according to an embodiment of the present invention.
Figure 18:
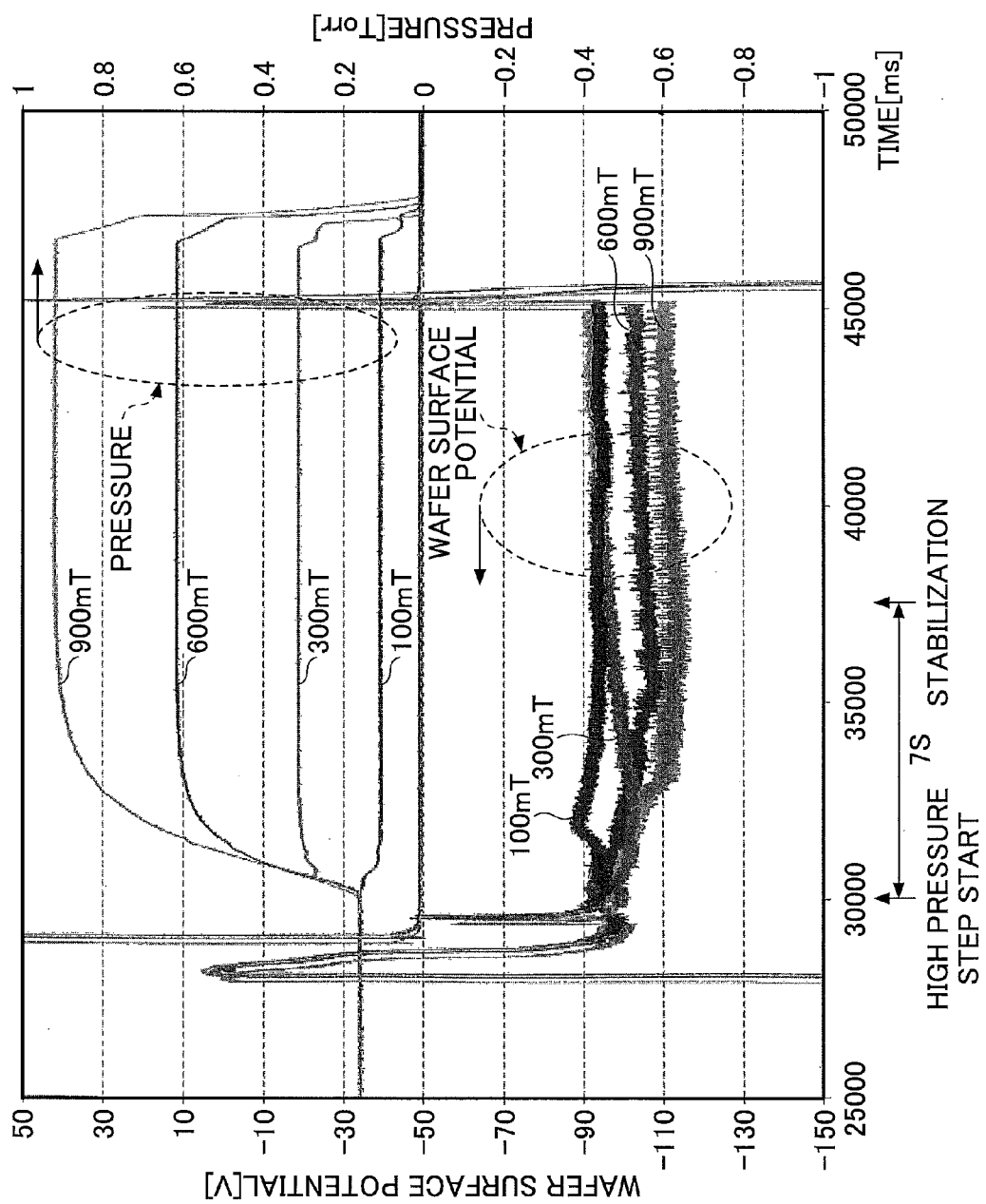
FIG. 18 illustrates measurement results of the surface potential of a wafer in a high pressure step according to an embodiment of the present invention.

The movement of the residual charge in the above high pressure step may be determined by measuring the surface potential of the wafer W. FIG. 17 illustrates a configuration of a device including a surface potential meter for measuring the surface potential of the wafer W according to the present embodiment. FIG. 18 illustrates measurement results of the wafer surface potential in the high pressure step according to the present embodiment.

In the following, the device including the surface potential meter as illustrated in FIG. 17 is briefly described. An aluminum wiring 200 is connected to the wafer W that is mounted on the mounting table 102 within the chamber C. The aluminum wiring 200 is arranged to penetrate through a chamber wall 150 to extend outside the chamber C. The portion of the aluminum wiring 200 penetrating through the chamber wall 150 is sealed by an O-ring 155, and in this way, airtightness of the chamber C may be maintained. The aluminum wiring 200 is connected to an RF filter 201 outside the chamber C. The RF filter 201 removes high frequency components of an AC voltage (AC) and outputs only a DC voltage (DC). The aluminum wiring 200 is connected to a circular disc 202 made of copper at the output side of the RF filter 201. The circular disc 202 is placed on a base 203, and the base 203 is grounded. A surface potential meter 204 is a non-contact type surface potential meter that measures the surface potential of the circular disc 202. A measurement value is sent to a PC 205 that is connected to the surface potential meter 204, and the PC 205 analyzes the measurement value. The measurement value obtained by the surface potential meter 204 is the same potential as the surface potential of the wafer W. Accordingly, the surface potential of the wafer W may be determined by using the present device to measure the surface potential of the circular disc 202.

As process conditions for a plasma process in the present embodiment, the pressure within the chamber C was set to 80 mT, the high frequency power for plasma generation was set to 400 W, the high frequency power for biasing was set to 200 W, the voltage from the DC voltage source 112 was set to 150 V, the gas type and gas flow rates were set to $C_4F_8/Ar/O_2=60/200/38$ scam, and the process time was set to 10 s. Thereafter, the surface potential of the wafer W was measured during the high pressure step. FIG. 18 illustrates the measurement results obtained from the above.

Referring to FIG. 18, the chamber pressure during the high pressure step was set to 900 mT, 600 mT, 300 mT, and 100 mT. It can be appreciated that as the chamber pressure increases, the surface potential of the wafer W decreases. This may be attributed to the fact that as the chamber pressure is set higher in the high pressure step, movement of the residual charge at the surface of the electrostatic chuck 106 is promoted by the argon gas having a low ionization energy and the surface potential of the wafer W is decreased as a result.

Also, it can be appreciated that regardless of the chamber pressure set up in the high pressure step, the surface potential of the wafer W stabilizes after approximately 7 seconds after the high pressure step is started. Accordingly, it can be expected that the movement of the residual charge would be substantially completed within 10 seconds after starting the high pressure step.

[High Pressure Step/Process Time]

Figure 19:
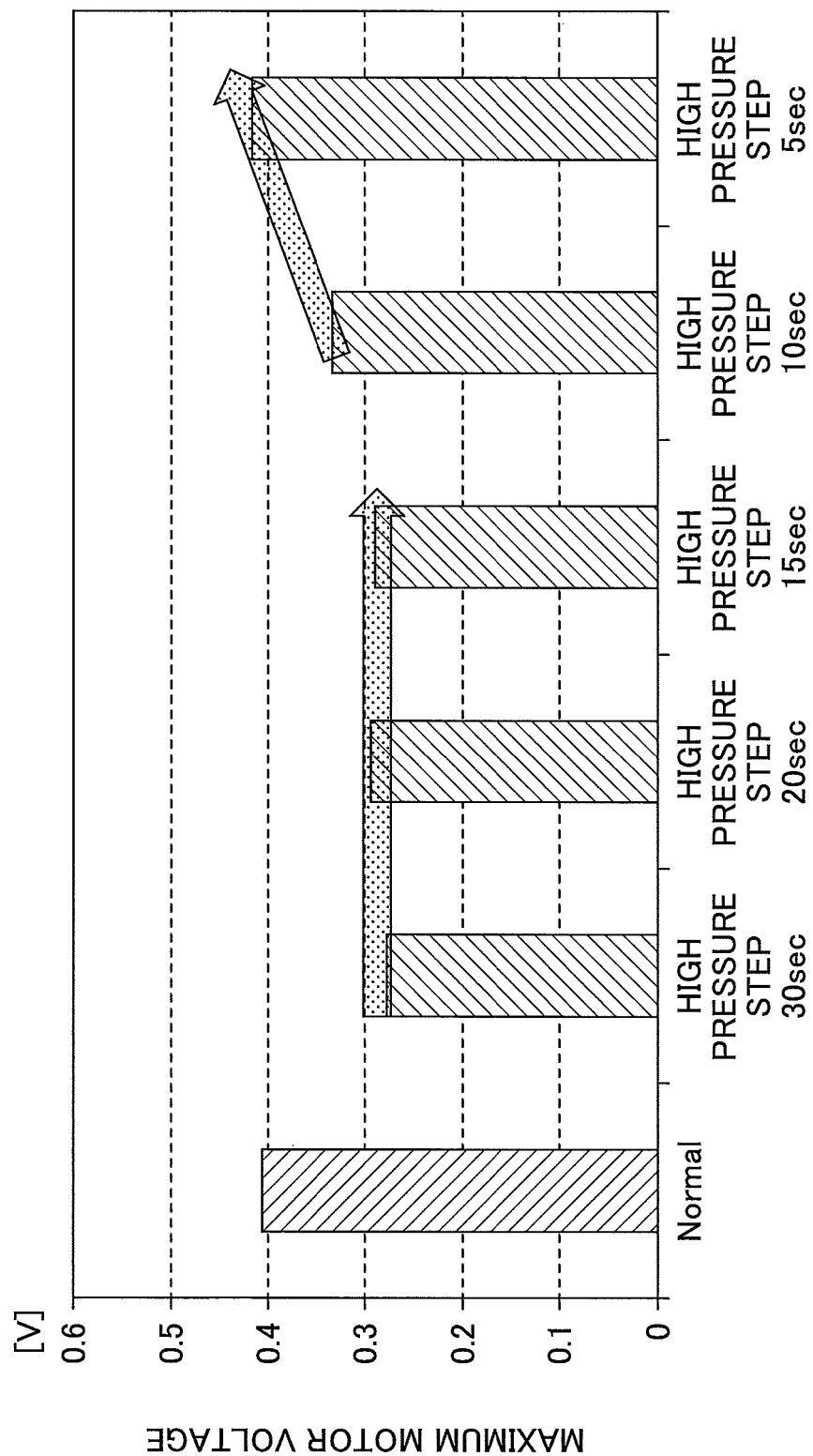
FIG. 19 illustrates attraction depending on time in a high pressure step according to an embodiment of the present invention.

In the following, experimental results of varying the process time in the high pressure step according to the present embodiment are described with reference to FIG. 19. FIG. 19 illustrates attraction depending on the process time in the high pressure step according to the present embodiment.

As process conditions of the high pressure step in the present case, the chamber pressure was set to 900 mT, argon gas was supplied at 1400 sccm, and the process time was set to 5 seconds, 10 seconds, 15 seconds, 20 seconds, and 30 seconds. FIG. 19 illustrates maximum motor voltages when the wafer W was de-chucked by the support pins 81 immediately after the above process times. Note that "Normal" in FIG. 19 represents the maximum motor voltage in a case where the wafer W was de-chucked by the support pins 81 under low-pressure process conditions where the pressure within the chamber C was set to 150 mT and argon gas was supplied at 600 sccm.

It can be appreciated from the above that the maximum motor voltage increases when the process time of the high pressure step becomes shorter than 15 seconds.

[High Pressure Step/Gas Type]

Figure 20:
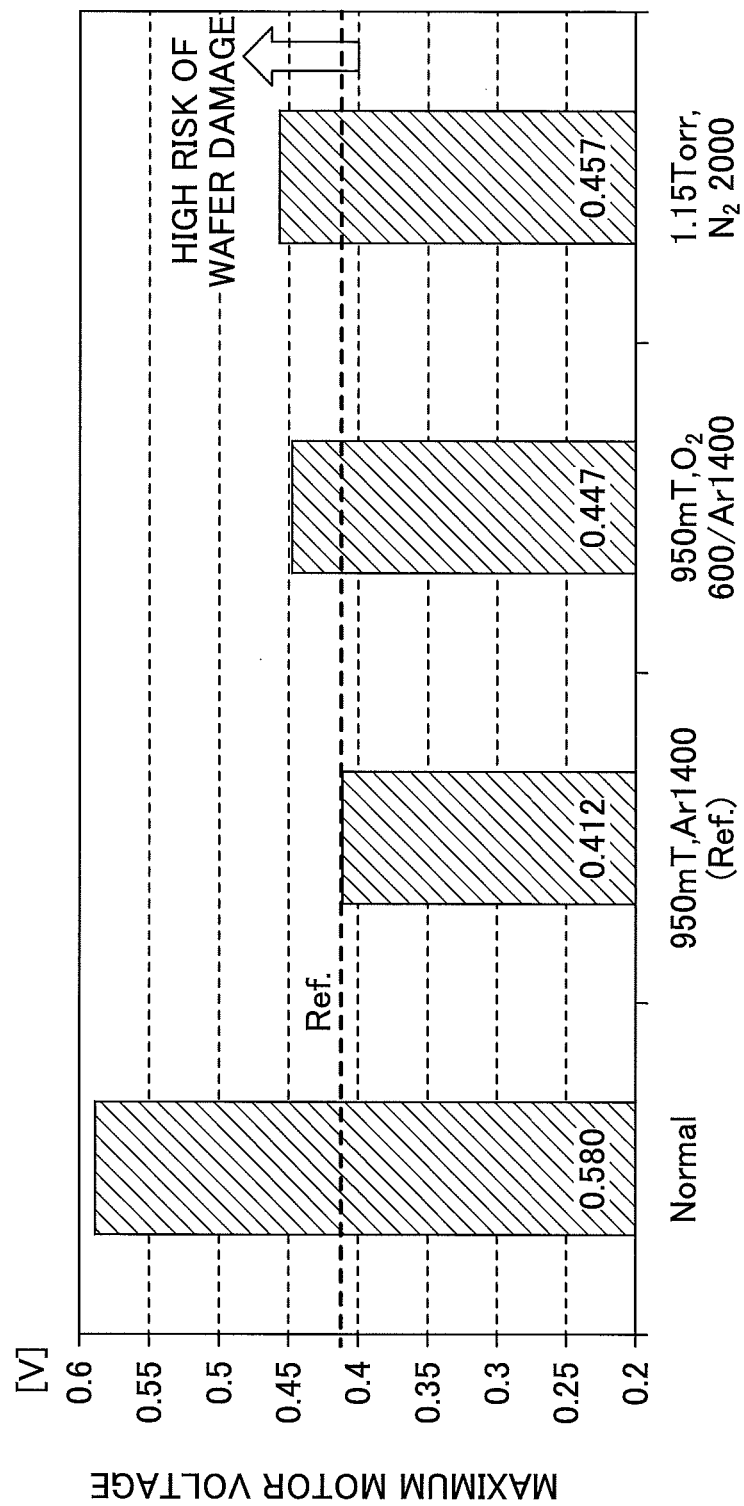
FIG. 20 illustrates attraction depending on gas type in a high pressure step according to an embodiment of the present invention.
Figure 21:
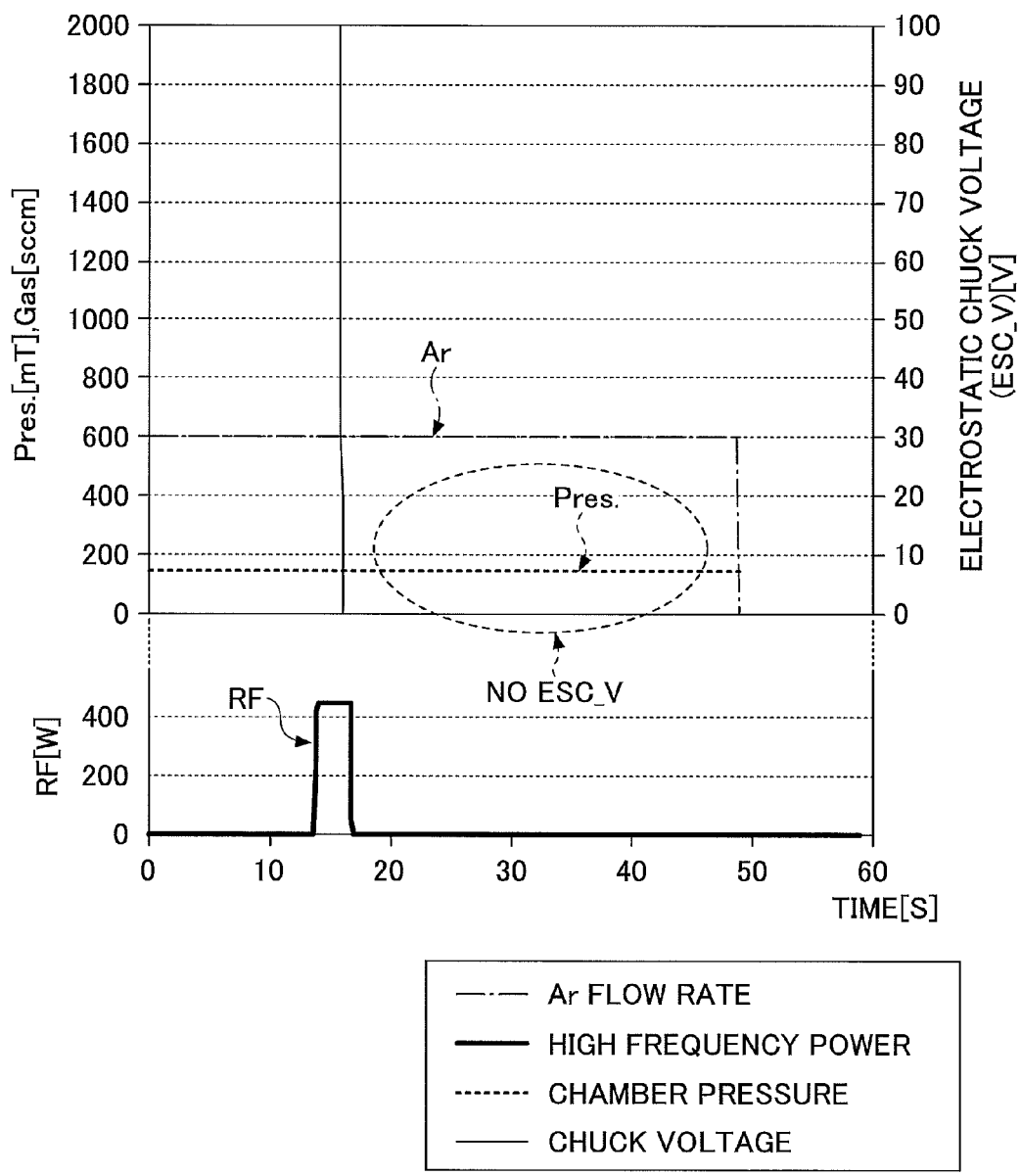
FIG. 21 illustrates the gas type and the electrostatic chuck voltage in a high pressure step according to an embodiment of the present invention.
Figure 22:
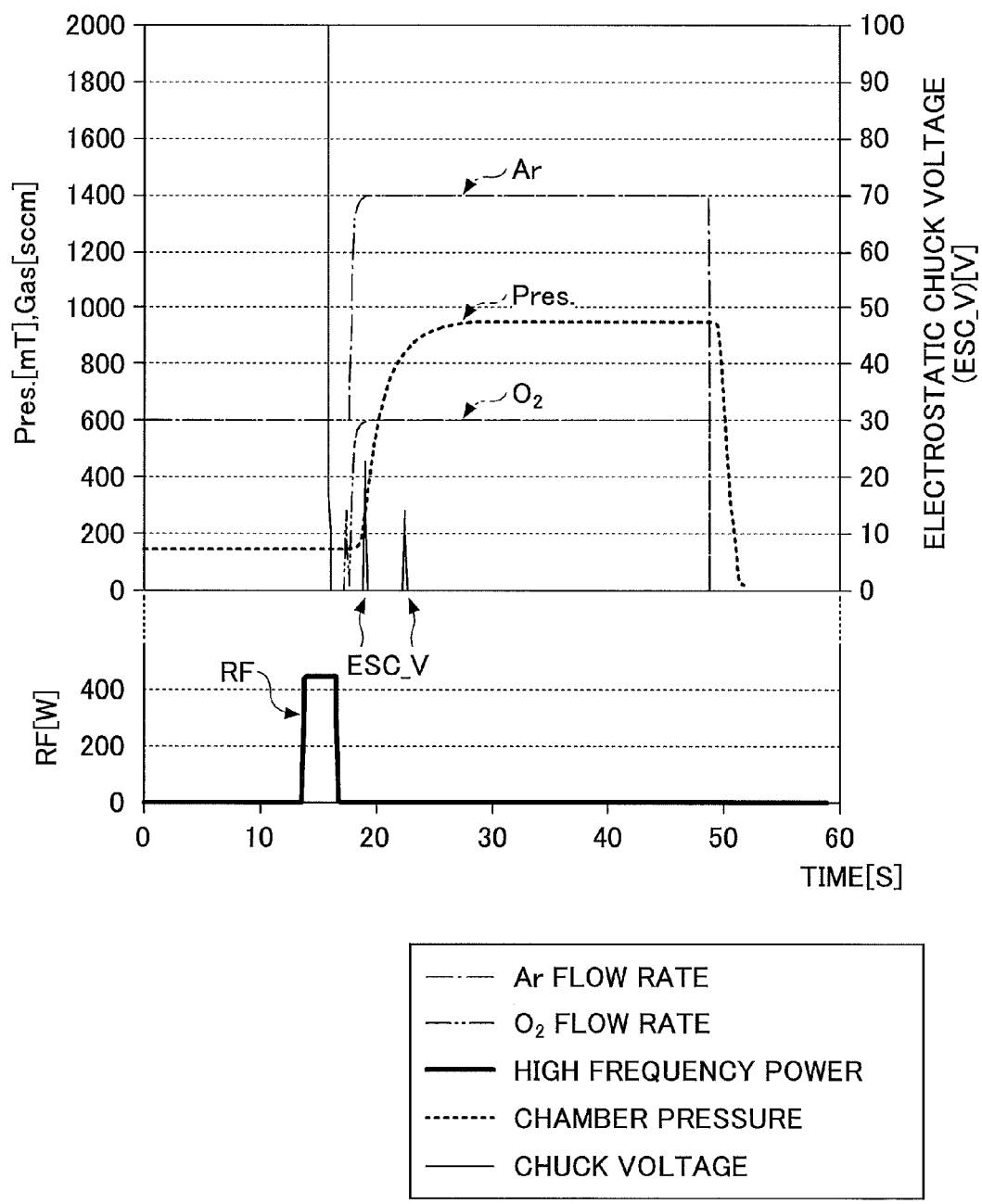
FIG. 22 illustrates the gas type and the electrostatic chuck voltage in a high pressure step according to an embodiment of the present invention.
Figure 23:
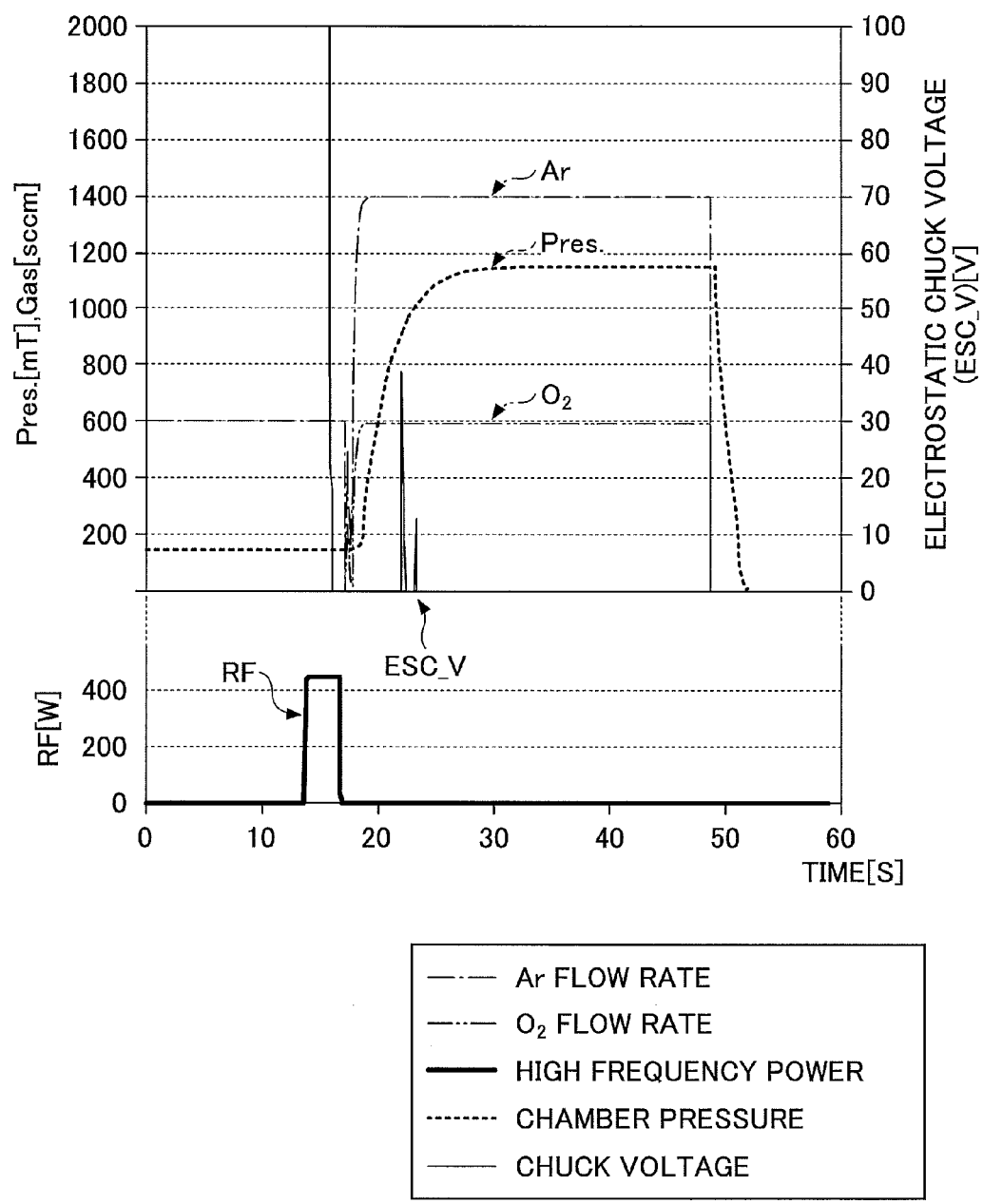
FIG. 23 illustrates the gas type and the electrostatic chuck voltage in a high pressure step according to an embodiment of the present invention.

In the following, experimental results of changing the gas type used in the high pressure step are described with reference to FIGS. 20-23. FIG. 20 illustrates attraction depending on the gas type in the high pressure step according to the present embodiment. FIGS. 21-23 illustrate the voltage of the electrostatic chuck 106 and the gas type used in the high pressure step according to the present embodiment.

In FIG. 20, "Normal" represents the maximum motor voltage in a case where the wafer W was de-chucked by the support pins 81 under low-pressure process conditions where the pressure within the chamber C was set to 150 mT and argon gas was supplied at 600 sccm.

Also, as the process conditions in the high pressure step for a comparative example ("Ref."), the chamber pressure was set to 950 mT (126.6 Pa) and argon gas Ar=1400 sccm was supplied. With respect to the above comparative example, two variations of the high pressure step were selected by varying the types of gases used. In one variation, the chamber pressure was set to 950 mT and a mixed gas of $O_2/Ar=600/1400$ sccm (gas type and gas flow rate) was supplied. In another variation, the chamber pressure was set to 1150 mT (153.3 Pa) and a single gas of $N_2=2000$ sccm (gas type and gas flow rate) was supplied.

It can be appreciated from the experimental results that in both the case where the mixed gas of $O_2$ and Ar is supplied and the case where the single gas of $N_2$ is supplied as compared with the comparative example where the pressure is 950 mT and a single gas of Ar=1400 sccm is supplied, the maximum motor voltage may be lower than the maximum motor voltage in the "Normal" case.

Also, as illustrated in FIG. 21, in the "Normal" case (low-pressure process conditions where the chamber pressure is 150 mT and argon gas is supplied at 600 sccm), voltage deflections in the electrostatic chuck 106 were not detected.

On the other hand, as illustrated in FIG. 22, in the case where the chamber pressure was set to 950 mT and the mixed gas of $O_2/Ar=1400/600$ sccm (gas type and gas flow rate) was supplied, voltage deflections in the electrostatic chuck 106 were detected. Similarly, as illustrated in FIG. 23, in a case where the chamber pressure was set to 1150 mT and the mixed gas of $Ar/O_2=1400/600$ sccm (gas type and gas flow rate) was supplied, voltage deflections in the electrostatic chuck 106 were detected.

Figure 24:
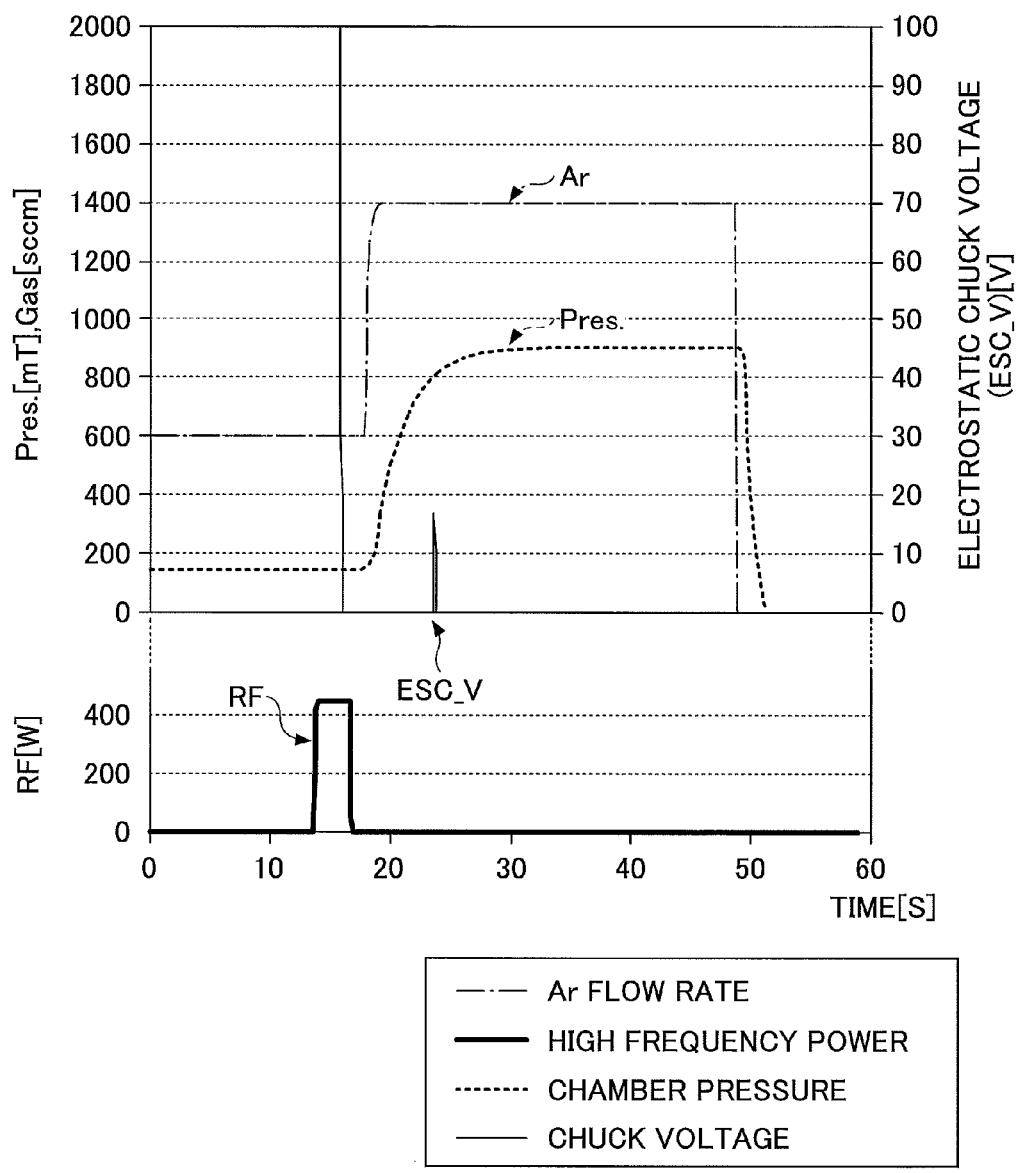
FIG. 24 illustrates the gas type and the electrostatic chuck voltage in a high pressure step according to an embodiment of the present invention.
Figure 25:
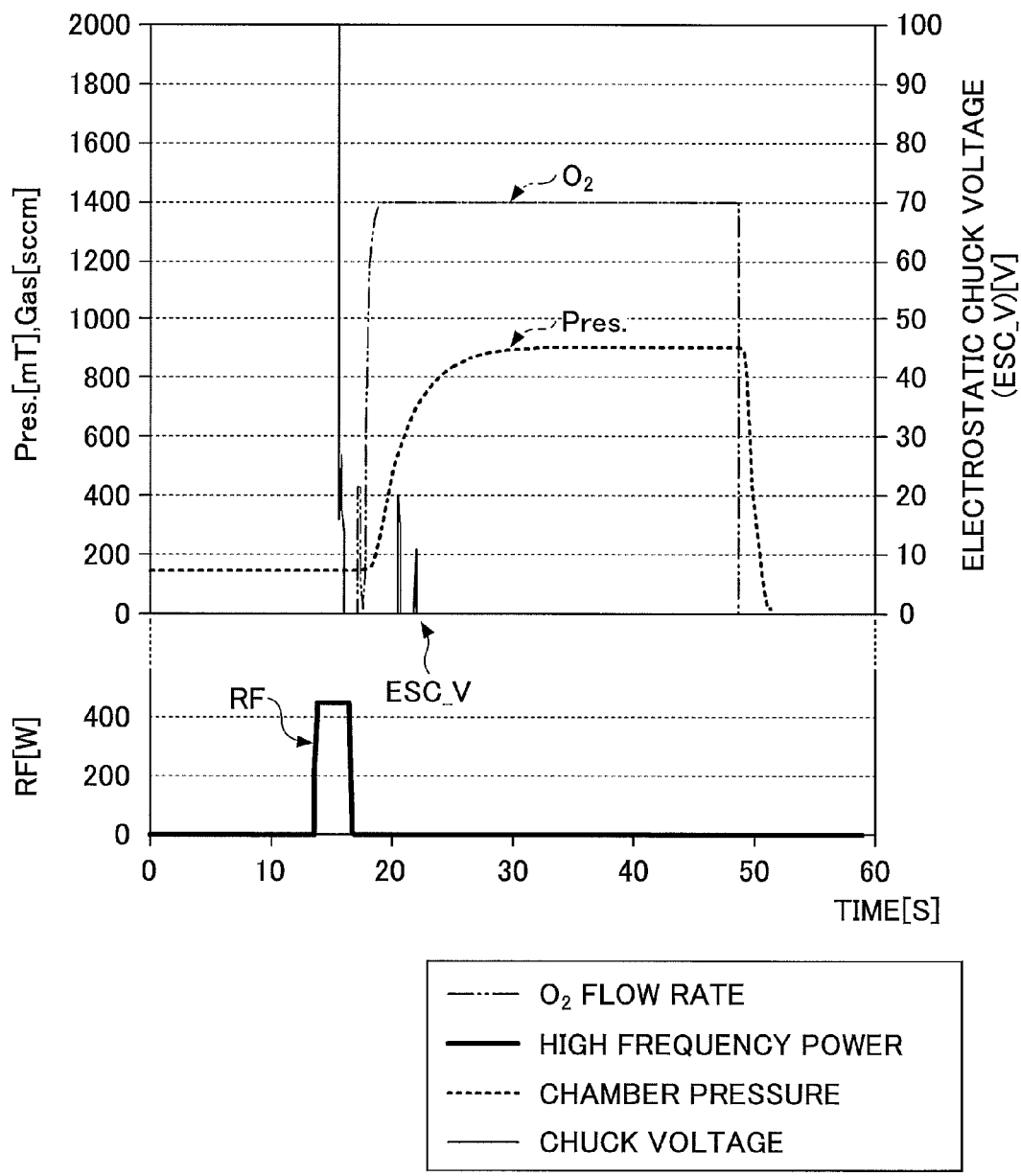
FIG. 25 illustrates the gas type and the electrostatic chuck voltage in a high pressure step according to an embodiment of the present invention.
Figure 26:
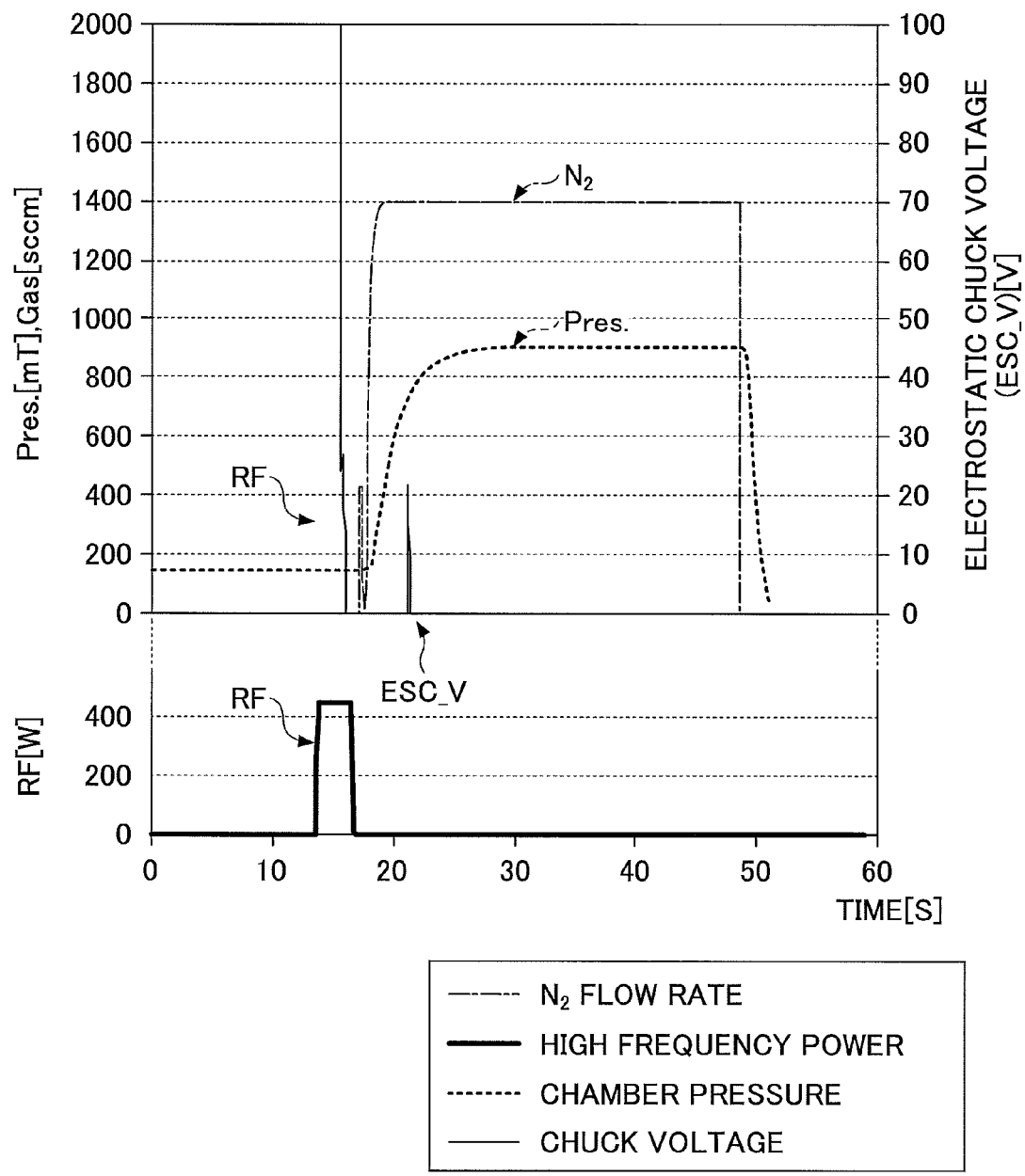
FIG. 26 illustrates the gas type and the electrostatic chuck voltage in a high pressure step according to an embodiment of the present invention.

FIGS. 24, 25, and 26 illustrate experimental results of setting the chamber pressure to 900 mT and varying the type of gas used in the high pressure step. In FIG. 24, only argon gas was supplied at 1400 sccm, in FIG. 25, only $O_2$ gas was supplied at 1400 sccm, and in FIG. 26, only $N_2$ gas was supplied at 1400 sccm. As can be appreciated, voltage deflections in the electrostatic chuck 106 could be detected in all of the above cases regardless of the type of gas used in the high pressure step.

It can be appreciated from the above that a "gas having a lower ionization energy than helium gas" to be supplied in the high pressure step is not limited to argon gas (Ar), but may also be a single gas of oxygen gas ($O_2$) or nitrogen gas ($N_2$), or a mixed gas including at least two gas types selected from a group consisting of argon gas, oxygen gas, and nitrogen gas. Other examples of a "gas having a lower ionization energy than helium gas" that may be supplied in the high pressure step include a gas having an ionization energy less than the ionization energy "24.587" of helium (He) as indicated in the chart of FIG. 27.

According to an aspect of the de-chuck control method of the present embodiment, attraction due to a residual charge at an electrostatic chuck surface layer may be prevented by implementing a high pressure step between a discharge step of introducing an inert gas into the chamber after a plasma process to perform a discharge process and a de-chuck step of de-chucking the wafer W from the electrostatic chuck 106 with the support pins 81. The high pressure step of the present embodiment involves introducing a gas having a lower ionization energy than helium gas and setting the pressure within the chamber C to a higher pressure than the pressure during the plasma process. In this way, damage to the wafer W while de chucking the wafer W from the electrostatic chuck 106 may be prevented and productivity may be improved.

[Modification of De-Chuck Control Method]

Figure 28:
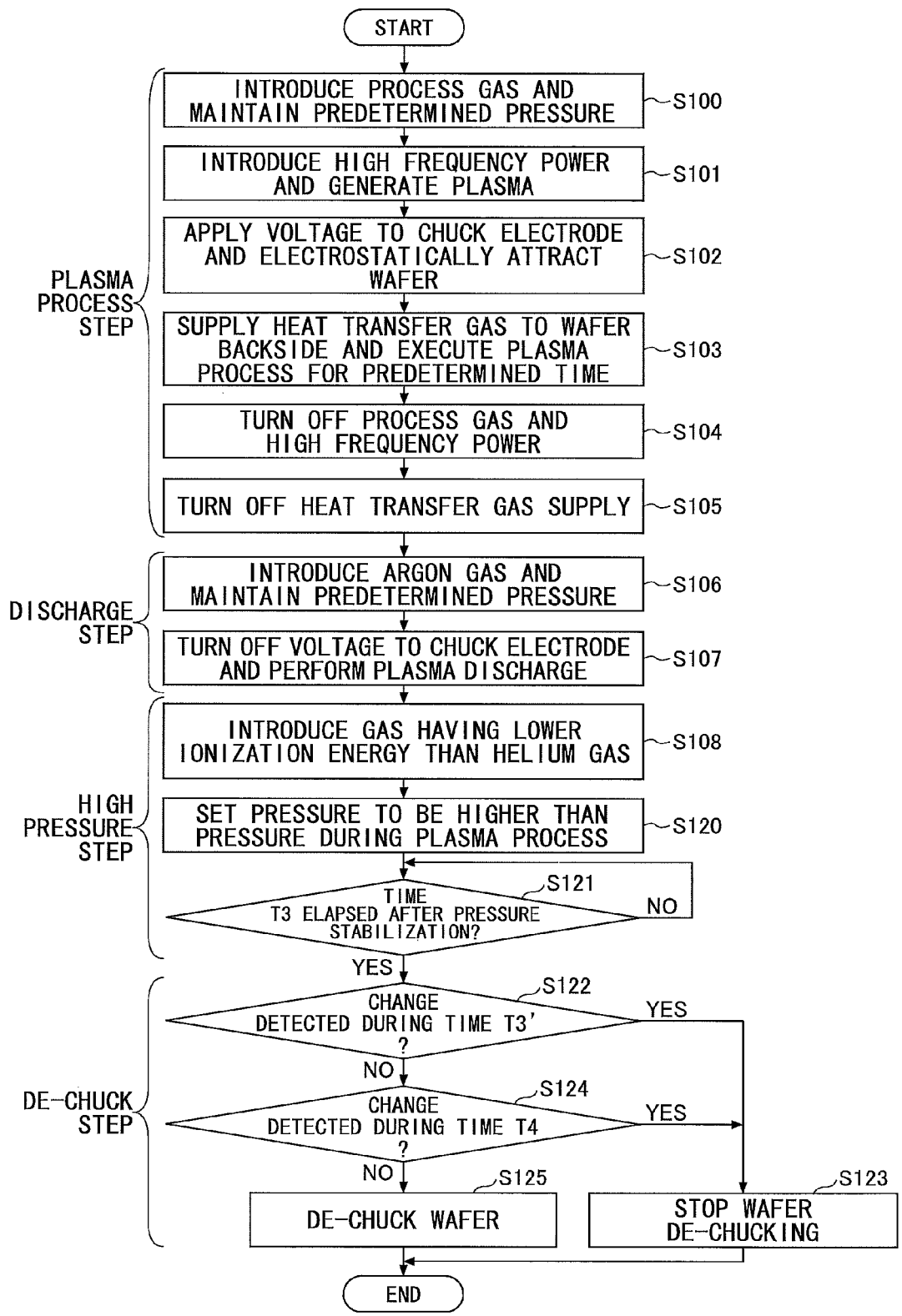
FIG. 28 is a flowchart illustrating a de-chuck control method according to a modified embodiment of the present invention.

A de-chuck control method for de-chucking the wafer W according to a modification of the present embodiment is described below with reference to FIGS. 28 and 29. FIG. 28 is a flowchart illustrating process steps for executing the de-chuck control method according to the modification of the present embodiment. FIG. 29 illustrates specific examples of executing the de-chuck control method according to the modified embodiment.

Note that the plasma process steps S100-S105, and the discharge process steps S106 and S107 are substantially identical to the corresponding process steps of the de-chuck control method according to the present embodiment except that in the modified embodiment, the voltage of the electrostatic chuck 106 starts being monitored in step S102. Accordingly, descriptions of the above process steps are omitted, and high pressure process steps and de-chuck process steps from step S108 and onward of the de-chuck control method according to the modified embodiment are described below.

After the discharge step, argon gas as an example of a gas having a lower ionization energy than helium gas is supplied at a higher flow rate than the preceding discharge step (step S108). Also, the pressure within the chamber C is set to a higher pressure than the pressure during the plasma process (or the pressure during the discharge process) (S120).

Then, it is determined whether a predetermined time T3 has elapsed (S121). After time T3 has elapsed (after pressure stabilization), it is determined whether a voltage change of at least a predetermined has been detected in the electrostatic chuck 106 during time T3' (S122). If a voltage change of at least a predetermined range is detected during time T3', it is determined that a residual charge of at least a predetermined amount resides in the surface layer of the electrostatic chuck 106, and de-chucking of the wafer W is stopped (S123) after which the process is ended. In FIG. 29 [a], a voltage change E3 of the electrostatic chuck 106 is detected during time T3', and as such, de-chucking of the wafer W is stopped.

If a voltage change is not detected in step S122, it is determined whether a voltage change in the electrostatic chuck 106 is detected during a time T4 (S124). If a voltage change is not detected, the wafer W is de-chucked (S125), and the process is ended. In FIG. 29 [b], no voltage change in the electrostatic chuck 106 is detected during time T3' and time T4, and as such, the wafer W is de-chucked by the support pins 81.

On the other hand, if a voltage change in the electrostatic chuck 106 is detected in step S124, de-chucking of the wafer W is stopped (S125), and the process is ended. Referring to FIG. 29 [a], even if no voltage change in the electrostatic chuck 106 is detected during time T3', if a voltage change E4 in the electrostatic chuck 106 is detected during time T4, de-chucking of the wafer W is stopped.

Note that in some embodiments, step S124 may be omitted, and if no voltage change in the electrostatic chuck 106 is detected during time T3' in step S122, the wafer W may be immediately de-chucked without performing step S124.

Also, note that the total time of time T3 and time T3' is the total time of the high pressure step which may be 30 seconds, for example. In this case, when pressure variations are reduced to be within ±5%, it may be determined that the pressure has stabilized, and at this point, time T3 may be ended and time T3' started.

According to an aspect of the de-chuck control method according to the modification of the present embodiment, by implementing the high pressure step as described above, the residual charge at the electrostatic chuck surface layer may be reduced and attraction of the wafer W may be prevented. Further, according to another aspect of the de-chuck control method according to the modification of the present embodiment, in the event the residual charge at the electrostatic chuck surface layer could not be reduced to a predetermined value or lower for some reason, de-chucking of the wafer W may be stopped to prevent damage to the wafer W.

Although a de-chuck control method and a plasma processing apparatus for implementing the de-chuck control method of the present invention have been described above with respect to certain illustrative embodiments, the present invention is not limited to these embodiments, and various modifications and improvements may be made within the scope of the present invention. Also, embodiments and modifications of the present invention may be combined to the extent practicable.

For example, in the above embodiments and modifications, the gas introduced into the chamber C during the discharge step and the gas introduced into the chamber C during the high pressure step are the same gases. However, the present invention is not limited to such an example, and different gases may be introduced in these steps. Note, however, that the gases introduced in the discharge step and the high pressure step are preferably arranged to be the same gases.

Also, examples of means for generating a plasma used in the present invention may include a capacitively coupled plasma (CCP) generating unit, an inductively coupled plasma (ICP) generating unit, a helicon wave plasma (HWP) generating unit, a microwave surface wave plasma generating unit for generating a microwave plasma such as a slot plane antenna (SPA) plasma or a microwave plasma generated from a radial line slot antenna, an electron cyclotron resonance plasma (ECR) generating unit, a remote plasma generating unit using the above plasma generating units, and the like.

Also, the workpiece subject to a plasma process in the present invention is not limited to a semiconductor wafer but may be a large substrate for a flat panel display (FPD), an electroluminescence (EL) element, or a substrate for a solar battery, for example.

The present application is based on and claims the benefit of priority of Japanese Patent Application No. 2012-200518 filed on Sep. 12, 2012, and U.S. Provisional Application No. 61/703,410 filed on Sep. 20, 2012, the entire contents of which are herein incorporated by reference.

DESCRIPTION OF THE REFERENCE NUMERALS 10 etching apparatus
81 support pin
85 heat transfer gas supply source
100 control device
106 electrostatic chuck
106a chuck electrode
110a first high frequency power source
112 DC voltage source
120 gas supply source
204 surface potential meter
255 process execution unit
260 control unit
265 storage unit
270 acquisition unit
275 monitor
C chamber

The invention claimed is:

1. A de-chuck control method for de-chucking a workpiece from an electrostatic chuck that electrostatically attracts the workpiece, the de-chuck control method comprising:
a discharge step of introducing an inert gas into a chamber after a plasma process and performing a discharge process, wherein the chamber pressure during the discharge step is above a chamber pressure during the plasma process;
a high pressure step of introducing a gas having a lower ionization energy than helium gas after the discharge step, increasing a pressure within the chamber to a pressure greater than 500 mT (66.7 Pa), and maintaining the pressure within the chamber at the pressure greater than 500 mT (66.7 Pa), wherein a chamber pressure during the high pressure step is above the chamber pressure during the discharge step; and
a de-chuck step of de-chucking the workpiece from the electrostatic chuck with a support pin while the pressure is maintained above 500 mT (66.7 Pa) by the high pressure step or after the higher pressure is maintained above 500 mT (66.7 Pa) by the high pressure step,
wherein
a surface of the electrostatic chuck facing the workpiece includes a protrusion, and
the high pressure step includes removing an electric charge accumulated in an insulating layer of residual deposits adhering to a surface of the protrusion.

2. The de-chuck control method as claimed in claim 1, wherein the de-chuck step includes de-chucking the workpiece from the electrostatic chuck with the support pin after the pressure within the chamber stabilizes to a steady state.

3. The de-chuck control method as claimed in claim 1, wherein a flow rate of gas introduced in the high pressure step is greater than a flow rate of gas introduced in the discharge step.

4. The de-chuck control method as claimed in claim 1 wherein the gas introduced in the high pressure step is $N_2$ gas, $O_2$ gas, Ar gas, or a mixed gas including at least two of $N_2$ gas, $O_2$ gas, and Ar gas.

5. The de-chuck control method as claimed in claim 1, further comprising:
a monitor step of monitoring a voltage of the electrostatic chuck for at least 10 seconds after a predetermined time elapses for stabilizing the pressure within the chamber to a steady state;
wherein the de-chuck step includes stopping a process of de-chucking the workpiece with the support pin in a case where a change greater than or equal to a predetermined range is detected in the voltage of the electrostatic chuck in the monitor step.

6. A plasma processing apparatus comprising:
an electrostatic chuck that includes a chuck electrode and is configured to electrostatically attract a workpiece, and a surface of the electrostatic chuck facing the workpiece includes a protrusion; and
a control unit configured to execute
a discharge step of introducing an inert gas into a chamber after a plasma process and performing a discharge process, wherein the chamber pressure during the discharge step is above a chamber pressure during the plasma process;
a high pressure step of introducing a gas having a lower ionization energy than helium gas after the discharge step, increasing a pressure within the chamber to a pressure greater than 500 mT (66.7 Pa), and maintain the pressure within the chamber at the pressure greater than 500 mT (66.7 Pa), wherein a chamber pressure during the high pressure step is above the chamber pressure during the discharge step, and
a de-chuck step of de-chucking the workpiece from the electrostatic chuck by a support pin while maintaining the pressure above 500 mT (66.7 Pa) or after maintaining the pressure 500 mT (66.7 Pa),
wherein
the higher pressure step includes removing an electric charge accumulated in an insulating layer of residual deposits adhering to a surface of the protrusion.

* * * * *